(12) United States Patent
Kim et al.

(10) Patent No.: US 8,320,763 B2
(45) Date of Patent: Nov. 27, 2012

(54) PLANAR LIGHTWAVE CIRCUIT (PLC) DEVICE WAVELENGTH TUNABLE LIGHT SOURCE COMPRISING THE SAME DEVICE AND WAVELENGTH DIVISION MULTIPLEXING-PASSIVE OPTICAL NETWORK (WDM-PON) USING THE SAME LIGHT SOURCE

(75) Inventors: Byoung-Whi Kim, Daejeon (KR); Manyong Park, Seoul (KR); Kyung-Hyun Park, Daejeon (KR); Hyun-Ho Yun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 713 days.

(21) Appl. No.: 12/517,533

(22) PCT Filed: Oct. 31, 2007

(86) PCT No.: PCT/KR2007/005466
§ 371 (c)(1),
(2), (4) Date: Oct. 1, 2009

(87) PCT Pub. No.: WO2008/069456
PCT Pub. Date: Jun. 12, 2008

(65) Prior Publication Data
US 2010/0119231 A1    May 13, 2010

(30) Foreign Application Priority Data

Dec. 5, 2006  (KR) .................. 10-2006-0122622
Dec. 6, 2006  (KR) .................. 10-2006-0123406
Dec. 6, 2006  (KR) .................. 10-2006-0123411
Sep. 14, 2007 (KR) .................. 10-2007-0093815

(51) Int. Cl.
*H04J 14/00* (2006.01)

(52) U.S. Cl. ......................................................... 398/68
(58) Field of Classification Search .................... 398/68, 398/196
See application file for complete search history.

(56) References Cited

U.S. PATENT DOCUMENTS
5,706,301 A * 1/1998 Lagerstrom .................... 372/32
(Continued)

FOREIGN PATENT DOCUMENTS
EP          1260846         11/2002
(Continued)

OTHER PUBLICATIONS

Korean Office Action for Application No. 9-5-2009-044866621, dated Oct. 30, 2009.
(Continued)

*Primary Examiner* — Shi K Li
(74) *Attorney, Agent, or Firm* — Nelson Mullins Riley & Scarborough LLP; EuiHoon Lee, Esq.

(57) ABSTRACT

In the manufacture and application of a PLC-ECL type wavelength tunable light source, provided is a wavelength tunable mechanism with improved performance and stability, a light source with improved packaging performance and mass productivity, and a light source applied to a WDM-PON with initialization and stabilization functions. The wavelength tunable light source having a PLC (planar lightwave circuit)-ECL (external cavity laser) structure includes a first housing in which a semiconductor optical gain medium is mounted, a second housing in which a PLC device is mounted, and a third housing in which an optical fiber is mounted. The first, second, and third housings make an optical axis alignment through an optical coupling lens and combined in a laser welding method.

13 Claims, 21 Drawing Sheets

U.S. PATENT DOCUMENTS

| | | | |
|---|---|---|---|
| 6,084,050 A * | 7/2000 | Ooba et al. | 528/42 |
| 6,122,416 A * | 9/2000 | Ooba et al. | 385/16 |
| 6,480,513 B1 | 11/2002 | Kapany et al. | |
| 6,954,561 B1 | 10/2005 | Khan et al. | |
| 2005/0036739 A1 * | 2/2005 | Doerr et al. | 385/46 |
| 2006/0078257 A1 | 4/2006 | Park et al. | |

FOREIGN PATENT DOCUMENTS

| | | |
|---|---|---|
| JP | 2005-522735 | 7/2005 |
| KR | 1020030047047 | 6/2003 |
| KR | 1020050065906 | 6/2005 |
| KR | 1020060041333 | 5/2006 |
| WO | 98/11460 A1 | 3/1998 |
| WO | 03/087922 A2 | 10/2003 |

OTHER PUBLICATIONS

International Search Report for Application No. PCT/US03/10820, 4 pages, dated Sep. 22, 2003.

* cited by examiner

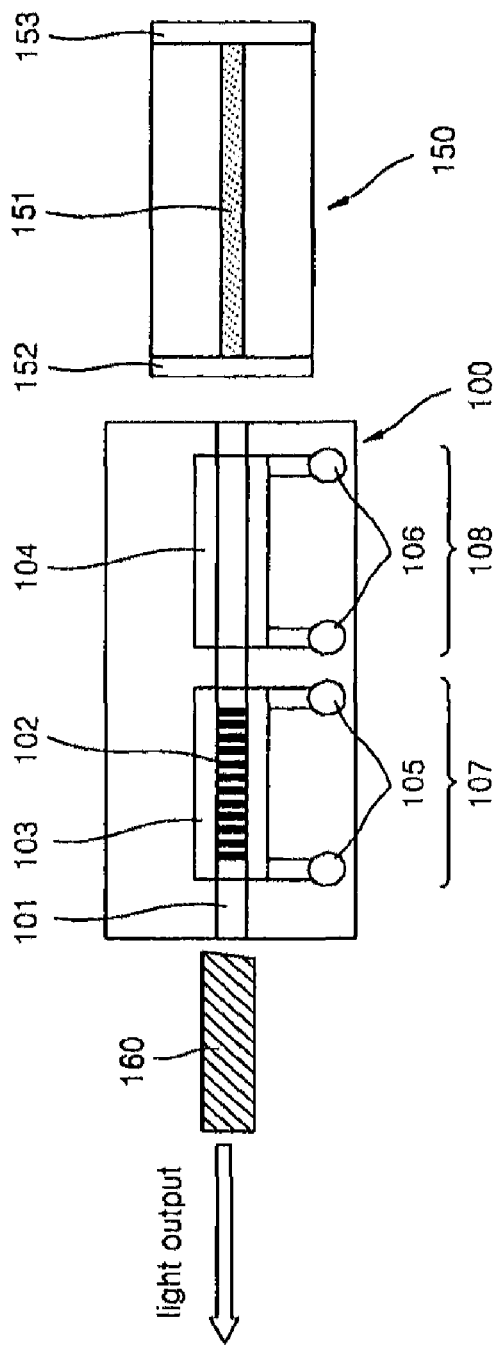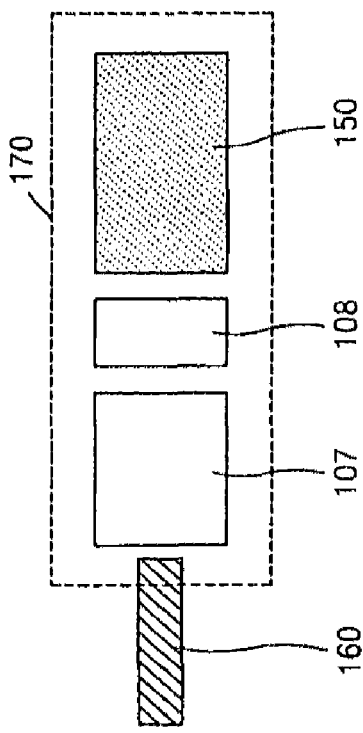

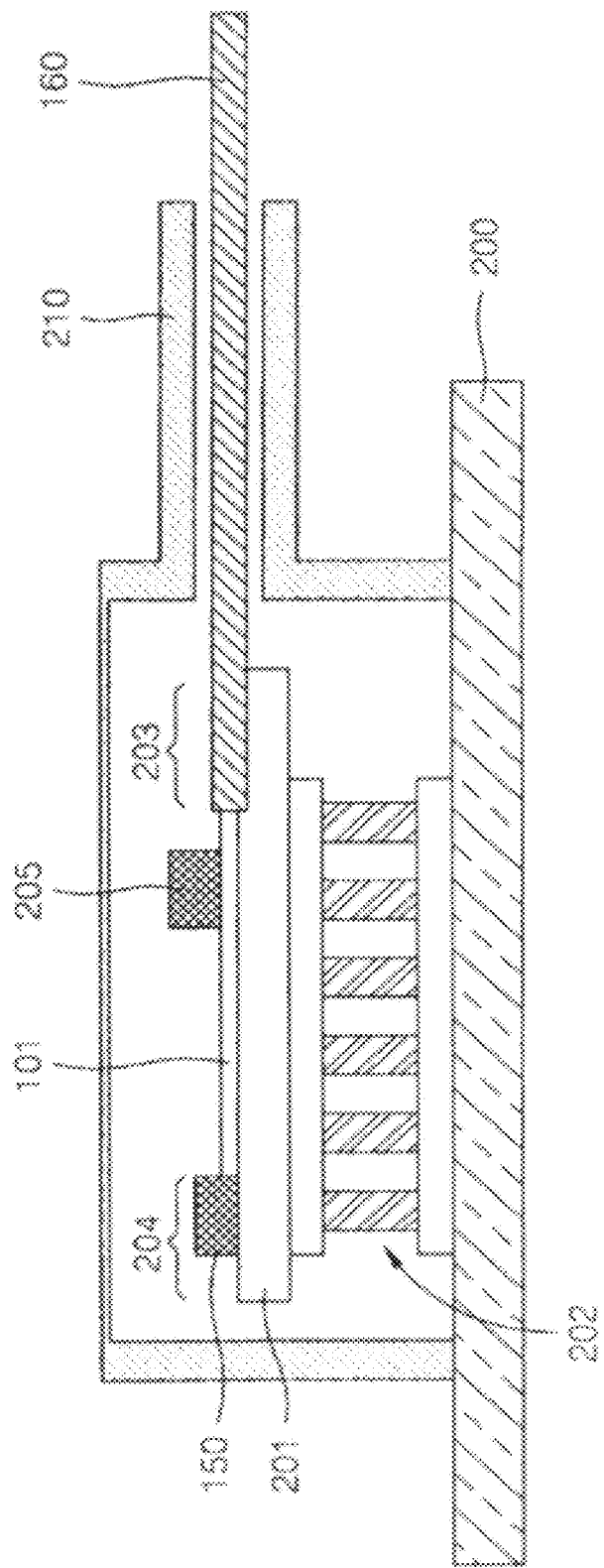

US 8,320,763 B2

PLANAR LIGHTWAVE CIRCUIT (PLC) DEVICE WAVELENGTH TUNABLE LIGHT SOURCE COMPRISING THE SAME DEVICE AND WAVELENGTH DIVISION MULTIPLEXING-PASSIVE OPTICAL NETWORK (WDM-PON) USING THE SAME LIGHT SOURCE

RELATED APPLICATIONS

This application is a 35 U.S.C. §371 national stage filing of International Application No. PCT/KR2007/005466 filed on Oct. 31, 2007, which claims priority to, and the benefit of, Korean Patent Application Nos. 10-2006-0122622 filed on Dec. 5, 2006, 10-2006-0123406 filed on Dec. 6, 2006, 10-2006-0123411 filed on Dec. 6, 2006 and 10-2007-0093815 filed on Sep. 14, 2007. The contents of the aforementioned applications are hereby incorporated by reference.

TECHNICAL FIELD

The present invention relates to optical communication, and more particularly, to a planar lightwave circuit (PLC) device using a thermo-optic effect, a wavelength tunable light source comprising the device and an optical transmitter, and a wavelength division multiplexing-passive optical network (WDM-PON) using the optical transmitter. The present invention is based on research carried out as part of the IT new growth driving core technology development project of the Ministry of Information and Communications (Project Management No.: 2005-S-401-02, Project Title: High Speed Passive Optical Network Technology Development).

BACKGROUND ART

Research and developments on a wavelength division multiplexing (WDM) based passive optical network (PON) to provide voice, data, and broadcast convergent services that will be widely activated in the next few years are actively taking place throughout the world. The WDM based PON is referred to as the WDM-PON.

The WDM-PON is a method of communicating between a center office (CO) and subscribers using multiple wavelengths assigned to each subscriber. Since an exclusive wavelength is used for each subscriber, security is superior and large capacity communication service is possible. Also, a different transmission technology in terms of, for example, a link rate and a frame format, can be applied for each subscriber or each service through the single optical fiber.

However, since the WDM-PON network is a technology to multiplex various wavelengths in a single optical fiber using WDM technology, a number of different light sources as many as the number of subscribers belonging to a single remote node (RN) are needed. The production, installation, and management of a light source for each wavelength which act as a considerable economic burden to both users and or service providers are big obstacles to the commercialization of the WDM-PON. To solve the problem, a method of applying a wavelength tunable light source device that can selectively tune the wavelength of a light source is being widely studied.

As an example of the wavelength tunable light source, there is a wavelength tunable light source in the form of an external cavity laser (ECL) formed by arranging individual optical parts such as a semiconductor LD, a planar lightwave circuit (PLC), and an optical fiber. In a conventional ECL wavelength tunable light source, the individual optical parts are all mounted on a substrate and the optical coupling between the semiconductor LD and the PLC is made using a butt coupling method. Accordingly, various problems are generated which will be described in detail in a description portion with reference to FIGS. 8A and 8B.

The PLC device is used for the wavelength tunable light source. The PLC device has a structure in which light can propagate in the upper portion of a substrate such as silicon. In general, the structure for guiding light includes a core layer in which light propagates and a clad layer encompassing the core layer and having a refractivity about 0.0001-0.01 lower than that of the core layer. The PLC device which has a small device size and is compatible with a semiconductor process has superior productivity and is capable of performing various functions. For example, the PLC device is widely used for, for example, an optical power distributor, a wavelength splitting/combining filter, an optical switch using a thermo-optic effect, a variable optical attenuator, and a wavelength variable filter.

FIGS. 1A and 1B are a structural diagram and a functional block diagram of a conventional wave tunable light source (PLC-ECL) using a planar type thermo-optic device. Referring to FIG. 1A, the conventional PLC-ECL type wavelength tunable light source includes a reflective semiconductor optical amplifier (RSOA) 150 working as an optical gain medium, a PLC device 100 having a 3-D optical waveguide core layer 101, and an attachment optical fiber 160. The RSOA 150 has an resonator 151 similar to a semiconductor laser. In the RSOA 150, a front exit surface 152 and a rear exit surface 153 are respectively coated with a non-reflective film and a high reflective film. Thus, since a self laser oscillation is restricted, the RSOA 150 functions as an optical gain medium.

Although not only the RSOA but also a reflective laser diode (R-LD) can be used as the optical gain medium, in the present description, the RSOA is mainly referred to a the optical gain medium for the convenience of explanation. A Bragg grating 102 is formed in a part of the 3-D optical waveguide core layer 101 of the PLC device 100. A thin film metal heater 103 is arranged close to the Bragg grating 102. When the RSOA 150 is driven after the 3-D optical waveguide core layer 101 of the PLC device 100 is optically coupled to the resonator 151 of the RSOA 150, the ECL is formed between the Bragg grating 102 and the high reflective film of the rear exit surface 153 and a laser having a wavelength matching an effective period of the Bragg grating 102 is oscillated. When the light output of the PLC device 100 is coupled to the attachment optical fiber 160, a light source applicable to an external optical communication network is produced.

When current is applied to electrodes 105 at both ends of the thin film metal heater 103, the heat generated from the thin film metal heater 103 increases the temperature of the 3-D optical waveguide core layer 101 that is adjacent thereto. Accordingly, the refractivity of the 3-D optical waveguide core layer 101 is decreased by the thermo-optic effect, which shortens the effective period of the Bragg grating 102 so that the output light wavelength of a PLC-ECL 170 of FIG. 1B is varied toward the short wavelength. The Bragg grating 102 and the electrodes 105 at both ends of the thin film metal heater 103 constitute a wavelength tunable area 107. A thin film metal heater 104 arranged at the 3-D optical waveguide core layer 101 where the Bragg grating 102 is not formed and electrodes 106 at both ends of the thin film metal heater 104 constitute a phase control area 108. The phase control area 108 controls a round trip phase of the output light wavelength of the PLC-ECL 170 selected by the wavelength tunable area 107.

Referring to FIG. 1B, the PLC-ECL 170 includes the RSOA 150 as an optical gain medium, the phase control area 108, the wavelength tunable area 107, and the attachment optical fiber 160 according to the function thereof. In the following description, the phase control area 108 is omitted for the convenience of explanation.

FIG. 2A is a perspective view of a conventional 3-D optical waveguide type thermo-optic device, that is, the wavelength tunable area of the wavelength tunable light source of FIG. 1A. Referring to FIG. 2A, the wavelength tunable area 107 includes an underclad layer 111 provided on a silicon substrate 110, the 3-D optical waveguide core layer 101 where a core layer is formed in a 3-D rod shape, and an overclad layer 112 covering the upper portion of the 3-D optical waveguide core layer 101. In FIG. 2A, the thin film metal heater arranged close to the light waveguide is not illustrated.

The thickness tunable Bragg grating 102 formed in an interference exposure-etching method is provided in part of the upper portion of the 3-D optical waveguide core layer 101. The Bragg grating 102 reflects a wavelength component corresponding to twice the effective Bragg grating period with respect to the light propagated in the 3-D optical waveguide core layer 101, thus forming an ECL oscillator with respect to a corresponding wavelength. The 3-D optical waveguide core layer 101 and the clad layers 111 and 112 can be manufactured of various materials such as a semiconductor material, a dielectric material, and a polymer material.

FIG. 2B is a graph showing the thermo-optic effect of the optical waveguide type thermo-optic device of FIG. 2A. In FIG. 2A, the thermo-optic effect when the optical waveguide type thermo-optic device of FIG. 2A is manufactured of a polymer material is shown. Referring to FIG. 2A, a polymer used as an optical waveguide generally has a thermo-optic coefficient or a coefficient of thermal expansion (CTE) of about $(-0.7 \sim -2.2) \times 10^{-4}/^\circ C$. The thermo-optic coefficient of the polymer used in the experiment is about $-1.822 \times 10^{-4}/^\circ C$. That is, the refractivity of the optical waveguide formed of the polymer decreases as temperature increases. Accordingly, the effective period of the Bragg grating 102 is reduced so that the output optical wavelength of the PLC-ECL 170 is varied toward a short wavelength.

FIGS. 3A and 3B are a cross-sectional view and a front view of a thin film metal is heater portion of the conventional PLC. Referring to FIG. 3A, the conventional PLC de vice includes a silicon substrate 110, an underclad layer 111 provided on the silicon substrate 110, the 3-D optical waveguide core layer 101 where the Bragg grating 102 is formed, the overclad layer 112 provided on the 3-D optical waveguide core layer 101, and the thin film metal heater 103 arranged on the surface of the overclad layer 112.

In the PLC structure, when current is applied to the thin film metal heater 103, the temperature of the 3-D optical waveguide core layer 101 existing under the thin film metal heater 103 is partially increased. The refractivity of the 3-D optical waveguide core layer 101 is changed in proportion to the amount of change in temperature (DT) according to the thermo-optic coefficient of the optical waveguide material. Typically, in the temperature change amount DT, a reflectivity change amount Dn according to the thermo-optic coefficient is expressed by the following equation.

$$Dn = CTE \times DT \quad \text{[Equation 1]}$$

For the substrate 110, the temperature is maintained at a constant level by using a thermo-electric cooler (TEC) device or attaching a heat dissipating plate to prevent the temperature of the substrate 110 from being changed over time.

The thin film metal heater 103 is typically manufactured of chrome, nickel, nichrome, tungsten, and tungsten silicide and formed on the surface of the overclad layer 112 of the optical waveguide. The temperature of the 3-D optical waveguide core layer 101 is increased by applying current to the thin film metal heater 103 in a state in which the temperature of the substrate 110 is maintained at a constant level. The PLC configured as above has the following problem.

FIG. 4 is a graph showing the distribution of the temperature in the vertical direction of the thin film metal heater of the PLC device of FIG. 3A. Referring to FIG. 4, the temperature of the thin film metal heater 103 increases as the current applied to the thin film metal heater 103 increases. However, since the temperature of the substrate 110 is maintained at a constant level, the transfer of the temperature to the 3-D optical waveguide core layer 101 linearly decreases. That is, in the conventional PLC structure, since the temperature of the optical waveguide cannot be changed much through the heater, it is a disadvantage that the width of a tunable wavelength is narrow. In particular, the inclination of temperature (hereinafter, referred to as the temperature gradient) increases as the current applied to the thin film metal heater 103 increases. A high temperature gradient deforms the distribution of the refractivity around the 3-D optical waveguide core layer 101. Accordingly, when light propagates, light dispersion, a higher mode generating, and optical loss are generated so that the characteristic of the optical waveguide is degraded.

FIGS. 8A and 8B respectively are a plan view and a side view of a conventional wavelength tunable light source. Referring to FIGS. 8A and 8B, the wavelength tunable light source includes the PLC device 100, the RSOA 150, and the attachment optical fiber 160. In the conventional wavelength tunable light source, a silicon optical bench 201 having an RSOA assembly area 204 and an optical fiber assembly area 203 where a V-groove is formed, which are at both ends of the PLC device 100, is packaged in a butterfly type package 200. The attachment optical fiber 160 is assembled on the optical fiber assembly area 203 to be aligned to the 3-D optical waveguide core layer 101 of the PLC device 100 using the V-groove. The RSOA 150 is assembled on a pad arranged to be aligned to the 3-D optical waveguide core layer 101 of the PLC device 100, that is, the RSOA assembly area 204, in a flip chip bonding method. A thermo-electric cooler (TEC) 202 is attached to a lower portion of the silicon substrate, that is, the silicon optical bench 201, to maintain a constant temperature. A thermistor 205 is attached to an upper portion of the silicon substrate to monitor the temperature of the surface of the silicon substrate. An electrode pad in the package is electrically connected to a package lead 207 through a bonding wire 208.

The conventional wavelength tunable light source has the following problems in view of an optical coupling efficiency, a performance efficiency, and mass productivity that are major considerations in packaging of a PLC-ECL wavelength tunable light source. First, since the optical coupling among the RSOA 150, the 3-D optical waveguide core layer 101, the attachment optical fiber 160 is butt-coupling not using a lens, an optical coupling efficiency can be reduced to ½ at its maximum compared to a case of using a lens. In addition, the optical coupling efficiency is further degraded considering the flip chip bonding and the alignment error (1-2 μm) of the v-groove.

Second, since various parts constituting the wavelength tunable light source are mounted on a single substrate, it is not possible to selectively combine each of the functional portions with their best parts. Furthermore, when the performance of a part of the finally assembled light source, for example, the optical coupling efficiency between the RSOA and the PLC device, is low, the performance of the overall light source is degraded so that it is difficult to guarantee a performance quality and production yield.

Third, since various parts constituting the wavelength tunable light source are mounted on a single substrate, not only a total production yield is low but also repair and restoration is impossible when a problem is generated during the process. This causes a considerable burden in the quality management for device production. Thus, yield of an optical module device is lowered so that lowering of a price is very difficult.

The wavelength assigned to each subscriber node in the WDM-PON is determined by a wavelength passing through an arrayed wavelength grating (AWG) connected to the subscriber node. Accordingly, the WDM-PON system needs to support a series of initialization functions to align wavelengths to assigned intrinsic wavelengths when the network is connected to a subscriber node. Of the initialization methods, a method of determining the wavelength of an ONT (optical network terminal) based on an optical signal transmitted from an OLT (optical line terminal) to the ONT is most preferred.

In this case, an optical transmitter used for the ONT cannot use an independent light source that can self-oscillate but uses a separate seed light source provided by the OLT so as to use mode locking type light source or a reflection type light source. For such a source, an additional wavelength initialization function is not needed because an input light wavelength is used as it is. However, this method is applied only to the RSOA or an injection locking based FP-LD using a locking or reflection mechanism. Furthermore, the initialization function cannot be added to the wavelength tunable light source having a self-oscillation function.

DETAILED DESCRIPTION OF THE INVENTION

Technical Problem

To solve the above and/or other problems, in the manufacture and application of a PLC-ECL type wavelength tunable light source, the present invention provides a wave length tunable mechanism with improved performance and stability, a light source with improved packaging and mass productivity prospects, and a light source applied to a WDM-PON with initialization and stabilization functions.

In detail, first, in relation to the improvements of the performance and stability of a wavelength tunable mechanism, the present invention provides the structure of a PLC device which can reduce the temperature gradient between the upper and lower areas of the optical waveguide core layer, improve mechanical stability of a thin film metal heater, and reduce power consumption.

Second, in relation to the improvements of packaging and mass productivity of a wavelength tunable light source, the present invention provides the structure of a wavelength tunable light source which can stably improve an optical coupling efficiency among individual parts and the operation stability of a device within a changing external environment by individually manufacturing and modularizing individual parts constituting the wavelength tunable light source.

Third, in relation to the addition of the initialization and stability functions when the wavelength tunable light source is applied to the WDM-PON, the present invention provides a WDM-PON which can guarantee the quality of light in real time during the operation of a network and automatically tune an oscillation wavelength with a wavelength selected using only the wavelength of an input optical signal without intervention of a user in an optical transmitter having the wavelength tunable light source.

Technical Solution

According to an aspect of the present invention, a planar lightwave circuit (PLC) device comprises a silicon substrate, a heat blocking layer formed on the silicon substrate and thermally blocking the silicon substrate from an upper layer, a thin film metal heater formed on the heat blocking layer, and an optical waveguide having a clad layer and a core layer formed of polymer on the thin film metal heater.

A coefficient of thermal expansion (CTE) or a thermo-optic coefficient of the polymer of the core layer is $(-0.7 \sim -3.4) \times 10^{-4}$/K, the thickness and width of the core layer are respectively 3-8 µm, and the clad layer encompasses the core layer and has a thickness of 10-25 µm. A Bragg grating is formed in the core layer located above a portion where the thin film metal heater is formed, and the reflection wavelength of the Bragg grating is adjustable by driving the thin film metal heater to use a thermo-optic effect. The thin film metal heater is formed of a material selected from a group consisting of chrome (Cr), nickel (Ni), nichrome (Ni—Cr), tungsten (W), and tungsten silicide ($WSi_x$). The heat blocking layer is formed of silica doped with at least one of germanium (Ge), boron (B), and phosphorus (P), porous silicon, SOG (spin-on glass), and a polymer material, when the heat blocking layer is formed of the silica or SOG material, the thickness of the heat blocking layer is 10-30 µm, and when the heat blocking layer is formed of the porous silicon or polymer material, the thickness of the heat blocking layer is 5-20 µm.

A trench is formed in a part of the silicon substrate under the thin film metal heater and the width of the trench is more than twice the width of the thin film metal heater and the depth of the trench is 5-20 µm.

According to another aspect of the present invention, a wavelength tunable light source having a PLC (planar lightwave circuit)-ECL (external cavity laser) structure comprises a first housing in which a semiconductor optical gain medium is mounted, a second housing in which a PLC device is mounted, and a third housing in which an optical fiber is mounted, wherein the first, second, and third housings make an optical axis alignment through an optical coupling lens and combined in a laser welding method.

The semiconductor optical gain medium is either a reflective semiconductor optical amplifier (RSOA) or a reflective laser diode (R-LD) which has the reflectivity of a front exit surface is not more than 0.1% and the reflectivity of a rear exit surface is not less than 30%. The semiconductor optical gain medium is attached to a pedestal having an inclined surface between 2.5°-4.5° such that the optical axis of the semiconductor optical gain medium and the optical axis of the optical coupling lens form an angle between 2.5°-4.5°, and the pedestal is formed of ceramic or copper tungsten (CuW).

The first housing includes a thermo-electric cooler (TEC) and a thermistor, the semiconductor optical gain medium has a TO package, and a cuboidal TEC support formed of copper tungsten (CuW) having a coefficient of thermal expansion (CTE) different from the CTE of the TEC, the difference being within 10%, is inserted between the TEC and the TO package.

The PLC device is mounted on a lead frame with a thermistor and molded with thermal curing resin or epoxy resin, and cross-sectional surfaces at both ends of the PLC device are grinded at an angle between 5°-10° so that input and output surfaces of the optical waveguide are exposed. The second housing has a completely sealed housing structure of a mini butterfly package, the PLC device is mounted in the second housing with the TEC and thermistor, and a transparent window and a SUS flange for laser welding assembly are attached at each of both ends of the second housing so that the PLC device is optically coupled to the semiconductor optical gain medium and the optical fiber.

According to another aspect of the present invention, a wavelength tunable optical transmitter comprises a wavelength tunable light source, a 2×2 optical coupler, an optical power monitor monitoring an optical output, and a wavelength tuning control unit controlling an output optical signal wavelength of the wavelength tunable light source, wherein the wavelength tunable optical transmitter outputs an optical signal wavelength by being automatically tuned to an optical signal wavelength that is externally input.

The wavelength tunable light source comprises a semiconductor optical gain medium, a Bragg grating area, and a phase control area, and the wavelength tuning control part receives a current signal from the optical power monitor and controlling a current driving the semiconductor optical gain medium, the Bragg grating area, and the phase control area of the wavelength tunable light source. The wavelength tunable optical transmitter has an optical receiver attached at any one of output ports of the optical coupler and is used for a wavelength division multiplexing (WDM)-passive optical network (PON).

According to another aspect of the present invention, a wavelength division multiplexing (WDM)-passive optical network (PON) comprises an optical line terminal (OLT) having a reference optical wavelength light source (a seed light source), an optical circulator, a wavelength multi/demultiplexer, and an optical transmitter and an optical receiver, a remote node (RN) having a wavelength multi/demultiplexer, and an optical network unit or terminal (ONU/ONT) having an optical coupler, and an optical transmitter and an optical receiver, wherein a wavelength tunable optical transmitter that is automatically tuned to an externally input optical signal wavelength and outputs an optical signal wavelength by varying the optical signal wavelength is used in the optical transmitter of the OLT and the optical transmitter of the ONU/ONT to transmit an upstream/downstream optical signal wavelength.

The reference optical wavelength light source is any one of a luminescent diode (LED) emitting a light in a wavelength range including the WDM wavelengths being used for signal transmission, an amplified spontaneous emission (ASE) source, a distributed feedback-laser diode (DFB-LD) module array in which a plurality of single wavelength light sources corresponding to the WDM wavelengths are integrated, and a fiber ring laser.

The RN further comprises an optical power splitter and each of optical wavelengths is shared by a plurality of the ONUs/ONTs in a time division multiplexing (TDM) method.

According to another aspect of the present invention, a method of aligning an oscillation wavelength using a wavelength tunable optical transmitter including a wavelength tunable light source, a 2×2 optical coupler, an optical power monitor monitoring an optical output, and a wavelength tuning control unit controlling an output optical signal wavelength of the wavelength tunable light source, comprises turning off power of the wavelength tunable light source, finding a drive current of a Bragg grating area at which an optical current signal of the optical power monitor reaches its maximum by scanning a driving current injected into the Bragg grating area, initializing the wavelength of the wavelength tunable light source by tuning the wavelength of the wavelength tunable light source to an externally input optical signal wavelength by matching a reflection wavelength of the Bragg grating with the externally input optical signal wavelength, operating the wavelength tunable light source by applying a driving current into the optical gain medium, continuously controlling a current driving the phase control area by detecting an optical output of the wavelength tunable light source through the optical power monitor so that an optical current signal of the optical power monitor is maintained at its maximum, wherein the quality of an optical output and an optical wavelength of the wavelength tunable light source is stabilized.

Advantageous Effects

In the manufacture and application of a PLC-ECL type wavelength tunable light source, the followings are the advantages of the wavelength tunable mechanism with improved performance and stability, the light source with improved packaging performance and mass productivity, and the light source applied to a WDM-PON with initialization and stabilization functions.

In the manufacture and application of a PLC-ECL type wavelength tunable light source, the following are advantages of the wavelength tunable mechanism with improved performance and stability, the light source with improved packaging and mass productivity prospects, and the light source applied to a WDM-PON with initialization and stabilization functions.

First, by depositing a heat blocking layer having a superior adhesion force to the thin film metal heater between the underclad layer and the silicon substrate, the mechanical stability of the thin film metal heater can be obtained. Also, with the use of the heat blocking layer having a low thermal conductivity, by forming a trench in the substrate, the power consumption of the thin film metal heater can be reduced so that the low power consumption and stability of the PLC-ECL can be obtained.

Second, since the thin film metal heater exists under the underclad layer of a waveguide, not on the surface of the overclad layer of the waveguide, the temperature gradient in an area around the optical waveguide core layer is reduced so that light loss, the generation of a higher order, and the deformation of a waveguide material can be reduced. Also, not only the performance but also the reliability of the PLCD-ECL can be enhanced.

Third, since the individual parts constituting the wavelength tunable light source are modularized according to the functions thereof, the manufacture and performance management for each module and their integrated form are possible so that the performance of a light source is improved and production yield is increased. Also, since an active optical axis alignment between modularized parts is possible, the optical coupling efficiency between modules is improved so that the performance of the light source can be improved. Furthermore, mass productivity is improved by using a laser welding method in the assembly of modules.

Fourth, by sealing each individual module with hermetic sealing or using epoxy or resin, the stability and reliability of a PLC-ECL light source can be improved with respect to the change in the external environment.

Fifth, since the wavelength of the PLC-ECL light source is automatically tuned width respect to the wavelength of an externally input optical signal, a WDM-PON with a simple structure using the same wavelength in the transmission of upstream/downstream signals is embodied. Accordingly, the inventory management of a complicated WDM wavelength resources or a plurality of expensive single wavelength light sources or a plurality of BLS are not necessary so that simple and economic FTTH can be realized.

Sixth, in the initialization of wavelengths of a PLC-ECL and the stable maintenance of the wavelengths in operation, since the wavelength adjustment process is simple and automatically operated, the installation, operation, and management of the OLT and ONU transceivers are very easy at low costs.

DESCRIPTION OF THE DRAWINGS

FIGS. 1A and 1B are a structural diagram and a functional block diagram of a conventional wave tunable light source (PLC-ECL) using a planar type thermo-optic device.

FIGS. 8A and 8B respectively are a plan view and a side view of the conventional wavelength tunable light source.

MODE OF THE INVENTION

Figure 2A:
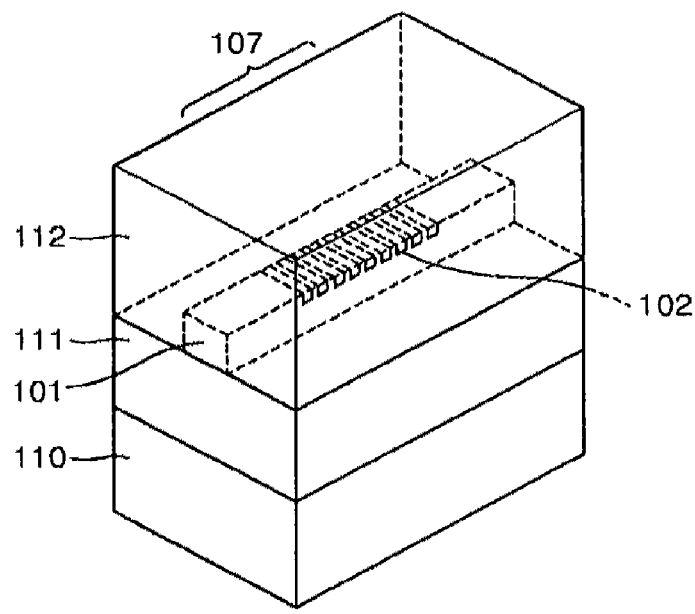
FIG. 2A is a perspective view of a conventional 3-D optical waveguide type thermo-optic device.
Figure 2B:
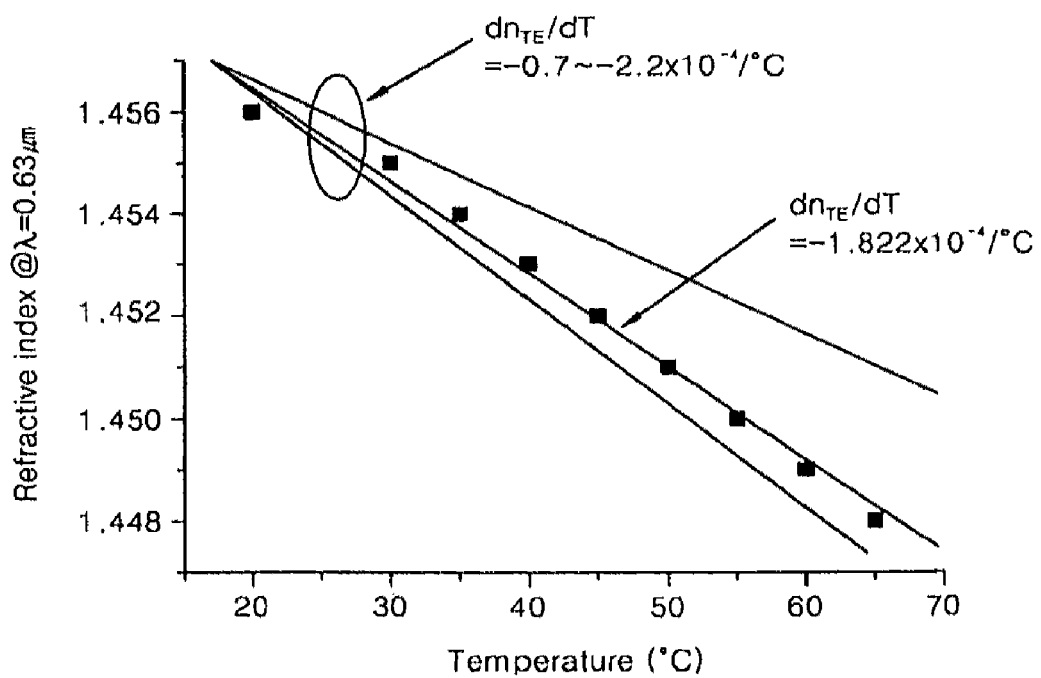
FIG. 2B is a graph showing the thermo-optic effect of the optical waveguide type thermo-optic device of FIG. 2A.
Figure 3A:
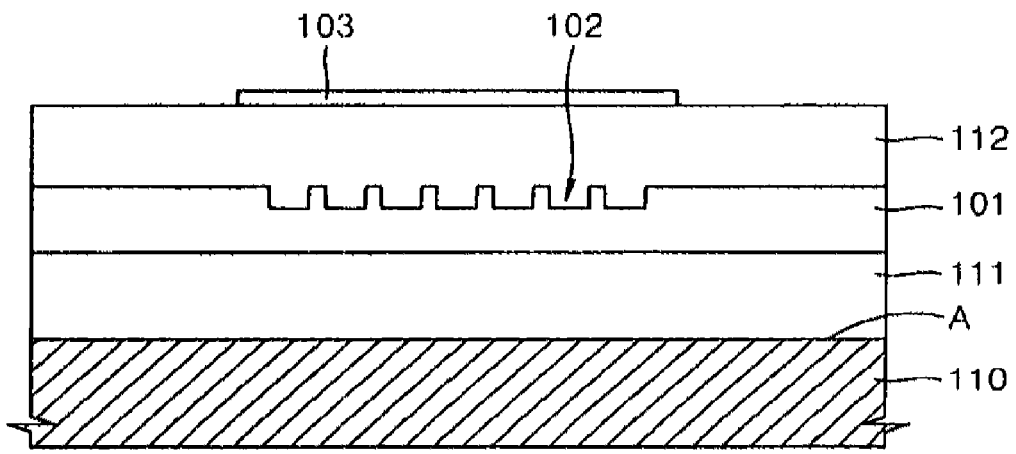
FIGS. 3A and 3B are a cross-sectional view and a front view of a thin film metal heater portion of the conventional PLC.
Figure 3B:
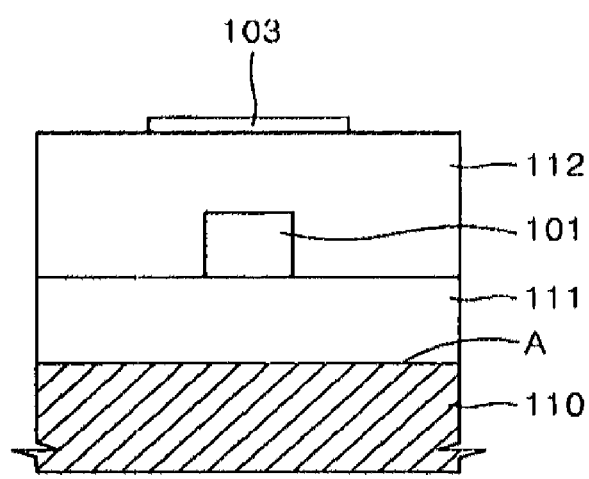

In WDM optical communications, single wavelength light sources operating for each of the WDM wavelength channels and numbering as many as the number of channels can be used or a wavelength tunable light source operating by varying to an arbitrary WDM wavelength channel can be used. The use of a wavelength tunable light source is recognized as being simple and economic in the configuration and maintenance of a WDM system. A wavelength tunable light source (PLC-ECL) comprising a PLC and RSOA using a thermo-optic effect in an optical waveguide with a wavelength selective diffraction grating as an external cavity structure is advantageous in that a wavelength toning method is simple, the self-optical signal tuning characteristic is superior, and a manufacturing cost is low.

The wavelength tunable performance of a PLC-ECL type wavelength tunable light source is determined by the diffraction grating period adjustment characteristic of a PLC using a thermo-optic effect. The tuning characteristic and the low cost of the light so urce are determined by the packaging structure and mass productivity. When the operation wavelength of the PLC-ECL wavelength tunable light source can be tuned to an external input optical wavelength, the PLC-ECL wavelength tunable light source can be used not only as a light source for a conventional WDM optical communication but also a WDM-PON type light source for a subscriber. Thus, the range of use of the PLC-ECL wavelength tunable light source is dramatically widened.

According to the present invention, in the embodiment of the PLC-ECL wavelength tunable light source, the performance and stability of a wavelength tunable mechanism are improved. When the PLC-ECL wavelength tunable light source is manufactured as an optical fiber attachment light source, the performance and productivity of a light source are improved. Also, the present invention provides a wavelength tuning method of operating a manufactured wavelength tunable light source at the same wavelength as an external input optical wavelength so that the manufactured wavelength tunable light source can be applied to the WDM optical communication.

The PLC wavelength tunable device consists of an optical waveguide core layer formed above a silicon substrate and a clad layer encompassing the core layer. A thin film metal heater is arranged adjacent to the optical waveguide. When the temperature of the optical waveguide is adjusted using the thin film metal heater, the period of a diffraction grating formed in a part of the optical waveguide is adjusted by the thermo-optic effect so that the ECL wavelength is tuned.

In the present invention, the structure and arrangement of the thin film metal heater that has a wide temperature adjustment range and simultaneously a temperature stability and reliability are provided to increase the wavelength tuning range and improve the stability of the tuned wavelength and the reliability of the PLC.

The performance of the PLC-ECL wavelength tunable light source is dominated not only by the performance of each of the RSOA and the PLC that are unit functional parts but also by the optical coupling characteristics between the RSOA and the PLC and between the PLC and the attachment optical fiber (pigtail fiber). In particular, the mass productivity in the packaging process of optically coupling-assembling the three parts determines the cost of the wavelength tunable light source. The present invention provides a package structure that can improve the performance of a wavelength tunable light source and simultaneously mass productivity, thus enabling lowering of the cost.

In an FTTH (fiber-to-the-home) that expects a massive need such as the WDM-PON, the oscillation wavelength of a light source at a subscriber side, that is, an optical network unit or terminal (ONU/ONT) has to be dynamically operated according to a physical link connected to the light source. The present invention suggests the structure and algorithm of a wavelength tunable optical transmitter that is stabilized by being automatically tuned to a downstream optical signal wavelength of an optical line terminal (OLT) and can output an upstream optical signal wavelength without a separate expensive optical device apparatus, for example, a wavelength monitor or a wavelength locker, and a WDN-PON structure using the wavelength tunable optical transmitter.

The present invention will now be described more fully with reference to the accompanying drawings, in which exemplary embodiments of the invention are shown. In the following description, it will also be understood that when a certain constituent element is referred to as being "on" or "under" another constituent element or is connected to other constituent element, the certain constituent element can be directly "on" or "under" another constituent element or be connected to the other constituent element, or a third constituent element may also be interposed therebetween. Also, in the drawings, the thicknesses of layers and regions are exaggerated for the convenience of explanation and clarity. Like reference numerals in the drawings denote like elements, and thus their description will be omitted. While the present invention has been particularly shown and described with reference to preferred embodiments using specific terminologies, the embodiments and terminologies should be considered in a descriptive sense only and not for purposes of limitation.

Figure 5A:
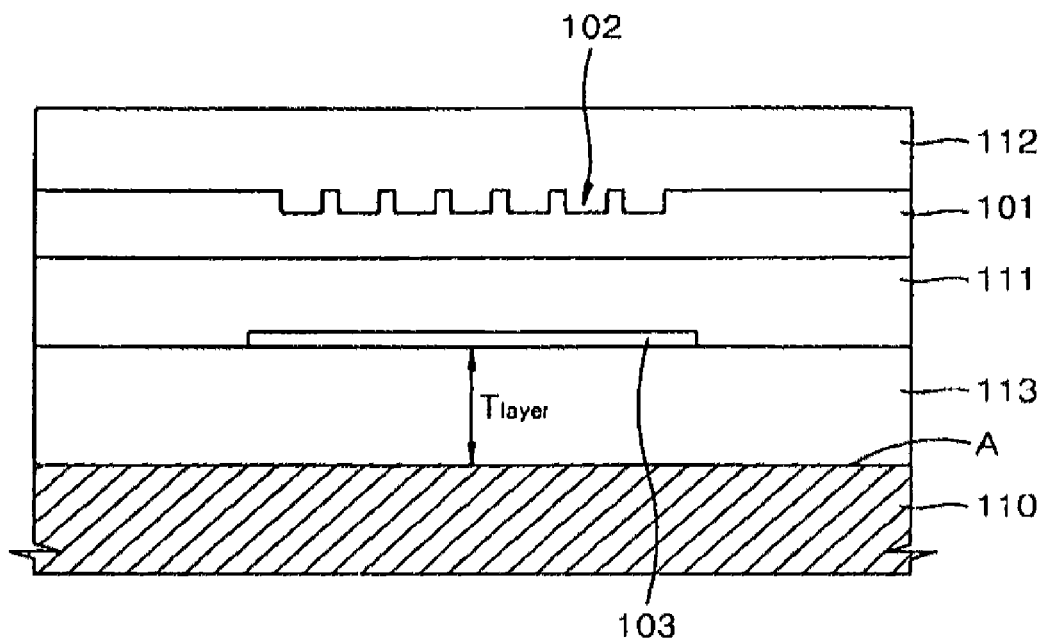
FIGS. 5A and 5B are a cross-sectional view and a front view of a portion of a thin film metal heater of a PLC device according to an embodiment of the present invention.
Figure 5B:
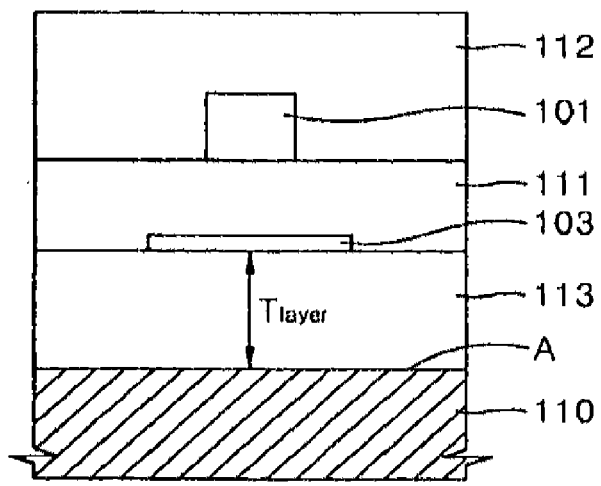

FIGS. 5A and 5B are a cross-sectional view and a front view of a portion of a thin film metal heater of a PLC device according to an embodiment of the present invention. Referring to FIGS. 5A and 5B, the PLC includes the silicon substrate 110, a heat blocking layer 113 on the silicon substrate 110, the thin film metal heater 103 on a surface of the heat blocking layer 113, and an optical waveguide including an underclad layer 111, the optical waveguide core layer 101, and the overclad layer 112. In the PLC device of the present embodiment, unlike the conventional technology, the thin film metal heater 103 is formed on a lower surface of the underclad layer 111 and the heat blocking layer 113 is formed between the underclad layer 111 and the silicon substrate 110.

The optical waveguide, in particular, the core layer 101, is preferably formed of a material having a high thermo-optic coefficient value. Typically, a polymer based material is used and a material having a thermo-optic coefficient value in a range of $(-0.7\sim-3.4)\times10^{-4}$/K according to the addition amount and composition of impurities is preferably used. Although it is not illustrated in the drawings, a thermo-electric cooler (TEC) device can be provided under the silicon substrate 110 or above the overclad layer 112 to maintain the temperature of a surface A of the silicon substrate 110 at a constant level.

The heat blocking layer 113 physically supports the thin film metal heater 103 and stops thermal power generated by the thin film metal heater 103 from passing to the silicon substrate 110. Thus, the material of the heat blocking layer 113 needs to have a superior coupling force with the thin film metal heater 103 and a sufficiently low thermal conductivity to reduce heat transfer from the thin film metal heater 103 to the silicon substrate 110. The thin film metal heater 103 is generally formed of chrome (Cr), nickel (Ni), nichrome (Ni—Cr), tungsten (W), and tungsten silicide ($WSi_x$). These metal materials exhibit superior coupling force with a glass material. Thus, silica with the addition of Ge/P/B, SOG (spin-on glass), porous silicon, and polymer are preferably used as a material satisfying the above two conditions. The thickness $T_{layer}$ of the heat blocking layer is inversely proportional to the thermal conductivity of the heat blocking layer 113. When the silicon or SOG material is used as the heat blocking layer 113, the thickness $T_{layer}$ of the heat blocking layer is preferably 10~30 p.m. When the porous silicon material and the polymer material are used as the heat blocking layer 113, the thickness $T_{layer}$ of the heat blocking layer is preferably 5-20 µm.

Figure 6:
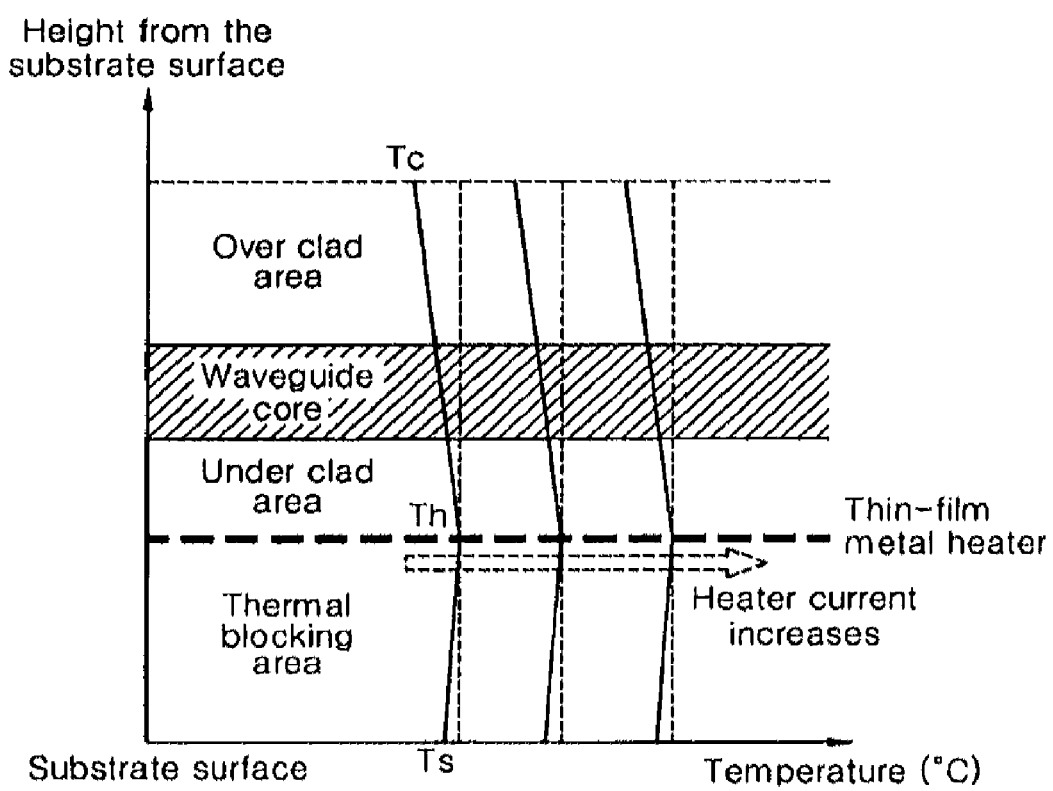
FIG. 6 is a graph showing the distribution of temperature in a vertical direction about the thin film metal heater portion of the PLC device of FIG. 5A.

FIG. 6 is a graph showing the distribution of temperature in a vertical direction about the thin film metal heater portion of the PLC device of FIG. 5A. FIG. 6 illustrates the distribution of temperatures in the upper and lower areas of the thin film metal heater 103 when the heat blocking layer 113 is used. The temperature of the silicon substrate 110 is maintained at a constant temperature by the TEC device.

Figure 4:
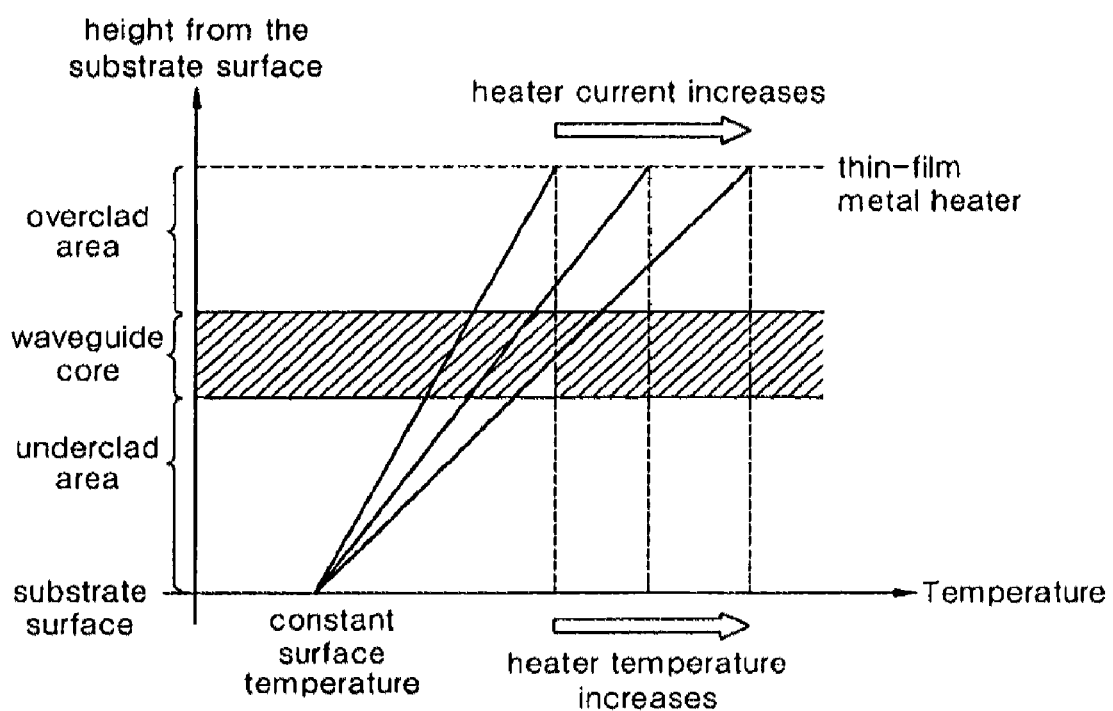
FIG. 4 is a graph showing the distribution of the temperature in the vertical direction on the thin film metal heater of the PLC device of FIG. 3A.

Referring to FIG. 6, the temperature gradient around the optical waveguide core layer 101 is negligible compared to the case of the conventional PLC shown in FIG. 4. Accordingly, the PLC device according to the present embodiment makes the distribution of the change in the refractivity of the optical waveguide core layer area due to thermo-optic effect constant so that the performance as a thermo-optic device can be improved. Also, a greater temperature change than that in the conventional PLC can be generated through the same injection current to the thin film metal heater, which is advantageous in view of power consumption. Ts denotes the temperature of a substrate, Th denotes the temperature of heater, and Tc denotes the temperature of the surface of the overclad layer.

Figure 7:
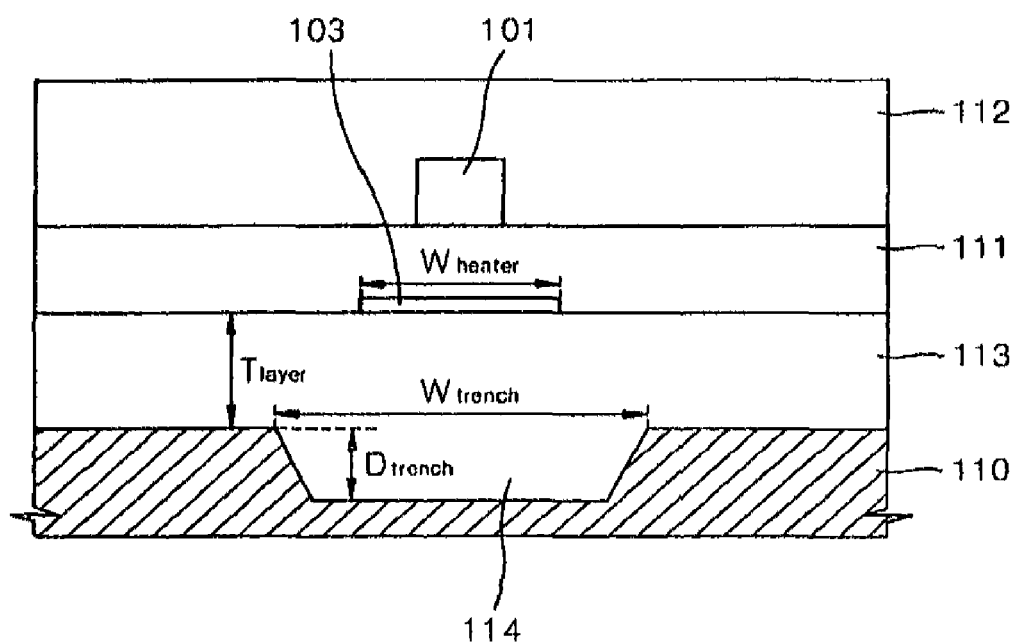
FIG. 7 is a cross-sectional view of the portion of a thin film metal heater of a PLC device according to another embodiment of the present invention.
Figure 8A:
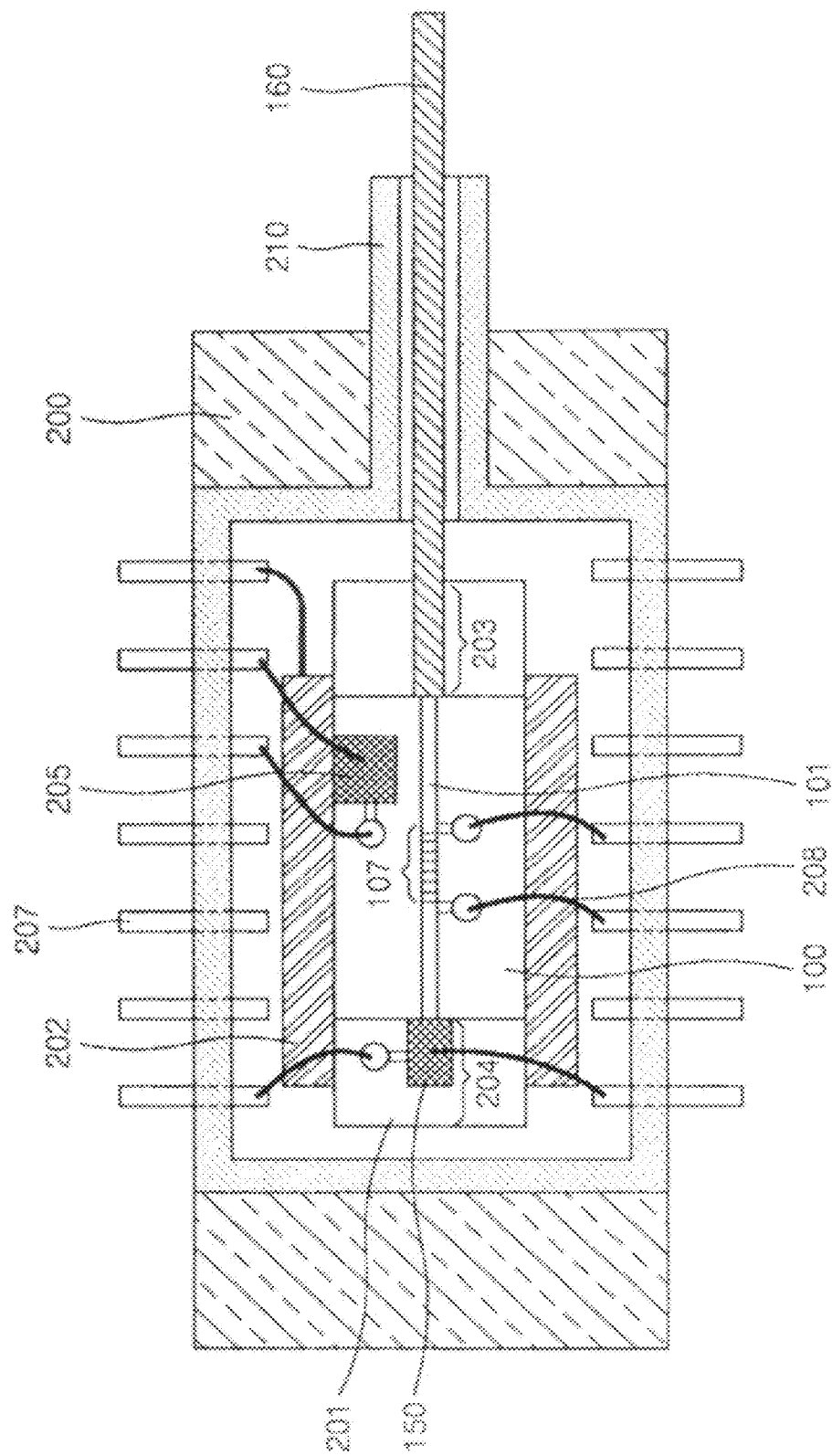

FIG. 7 is a cross-sectional view of a portion of a thin film metal heater of a PLC device according to another embodiment of the present invention. Referring to FIG. 7, the PLC device according to the present embodiment includes a trench 114 in a substrate to further lower the power consumption of the thin film metal heater 103 compared to the structure of FIG. 5. Since the distance from the thin film metal heater 103 to the bottom surface of the trench 114 is a total of a thickness $T_{layer}$ of the heat blocking layer 113+a thickness $D_{trench}$ of the trench 114, the distance increases as much as the thick ness $D_{trench}$ of the trench 114 compared to the case without the trench 114 so that a heat loss can be reduced. Accordingly, the power consumption of the thin film metal heater 103 can be reduced.

The trench 114 can be formed by etching the silicon substrate 110 in a wet etch method using a KOH solution or a dry etch method using plasma ions. The width $W_{trench}$ of the trench 114 needs to be typically greater, preferably by twice as much or more, than the width $W_{heater}$ of the heater 103. The thickness $D_{trench}$ of the trench 114 must be within a range allowed in the leveling process of the heat blocking layer 113, preferably between 5~20 µm.

Figure 9:
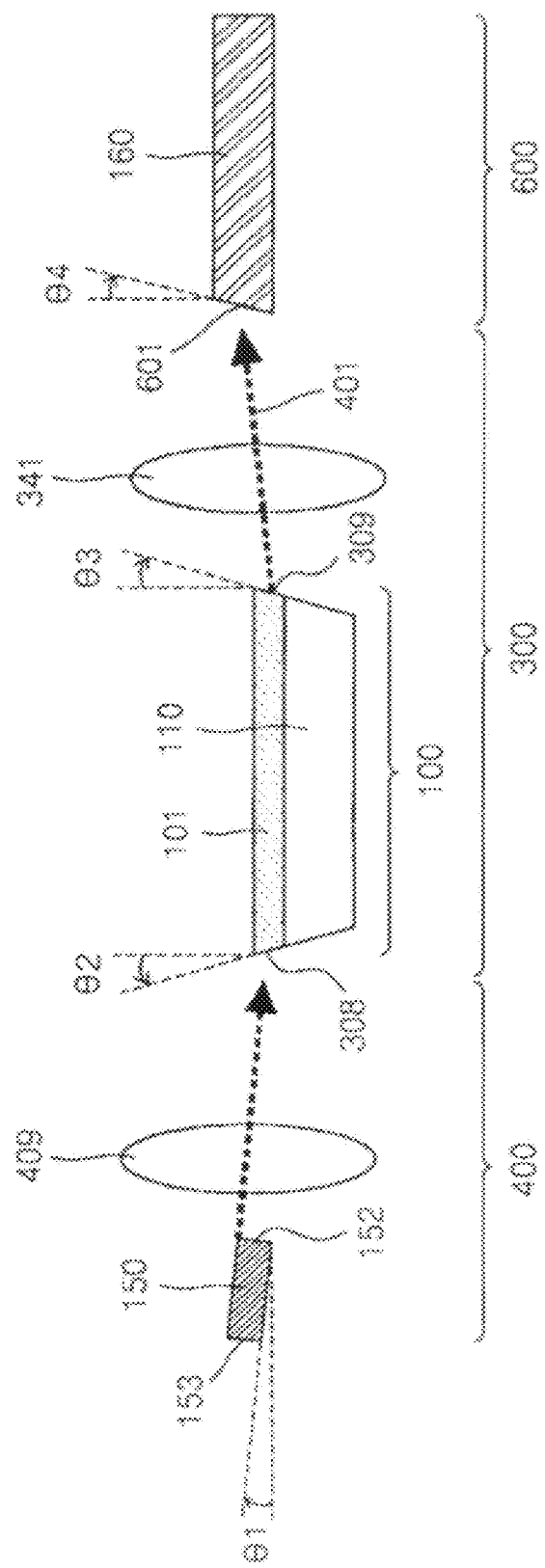
FIG. 9 illustrates the optical axis alignment applied to a wavelength tunable light source of the present invention.

FIG. 9 illustrates the optical axis alignment applied to a wavelength tunable light source of the present invention, showing an optical axis alignment method of the PLC-E CL wavelength tunable light source. Referring to FIG. 9, the PLC-ECL wavelength tunable light source includes an RSOA portion 400 having the RSOA 150 and an optical coupling lens 409, a PLC device portion 300 having the PLC device including an optical waveguide diffraction grating and an optical coupling lens 341, and an optical fiber portion 600 having the attachment optical fiber 160. Since the present drawing is for the purpose of a description of the optical axis alignment, the diffraction grating and a phase adjustment area that are not related to the optical axis alignment are not illustrated.

To obtain a high optical coupling efficiency between the respective optical functional parts and prevent the reflection of fine light between the respective optical functional parts, which are the requirements for the packaging of the wavelength tunable light source, the cross-section of each optical functional part of the wavelength tunable light source of FIG. 9 is polished at a predetermined angle or the RSOA 150 is inclined.

The inclination angle $\theta 1$ of the RSOA 150 is preferably a value in a range between 2.5-4.5. The angle $\theta 2$ of an input surface 308 of the optical waveguide core layer 101 coupled to the optical coupling lens 409 is preferably a value in a range between 5°-10°. The angle $\theta 3$ of an output surface 309 of the optical waveguide core layer 101 located at the opposite side of the input surface 308 and the angle $\theta 4$ of an optical fiber cross section 601 are preferably between 5°-10°.

The front exit surface 152 of the RSOA 150 is anti-reflection (AR) coated to reduce reflection. A reflectivity of the AR coating is preferably not more than 0.1%, and further, preferably not more than 0.01%. Also, the rear exit surface 153 opposite to the front exit surface 152 is high-reflection (HR) coated. A reflectivity of the HR coating is preferably not less than 30%. A mode size converter can be integrated at the side of the front exit surface 152 of the RSOA 150 for the efficient optical coupling to the optical waveguide core layer 101 of the PLC. To reduce a remaining reflection rate of the front exit surface 152, the oscillator can be inclined by 5°-8° vertically with respect to the front exit surface 152. Since the RSOA 150 in the PLC-ECL wavelength tunable light source functions as a semiconductor optical gain medium, the RSOA 150 can be replaced by a typical R-LD. Since the RSOA and the R-LD are different only in the amount of a difference in the gain of polarization, the RSOA and the R-LD are collectively referred to as the RSOA in the present invention as described above.

Figure 10:
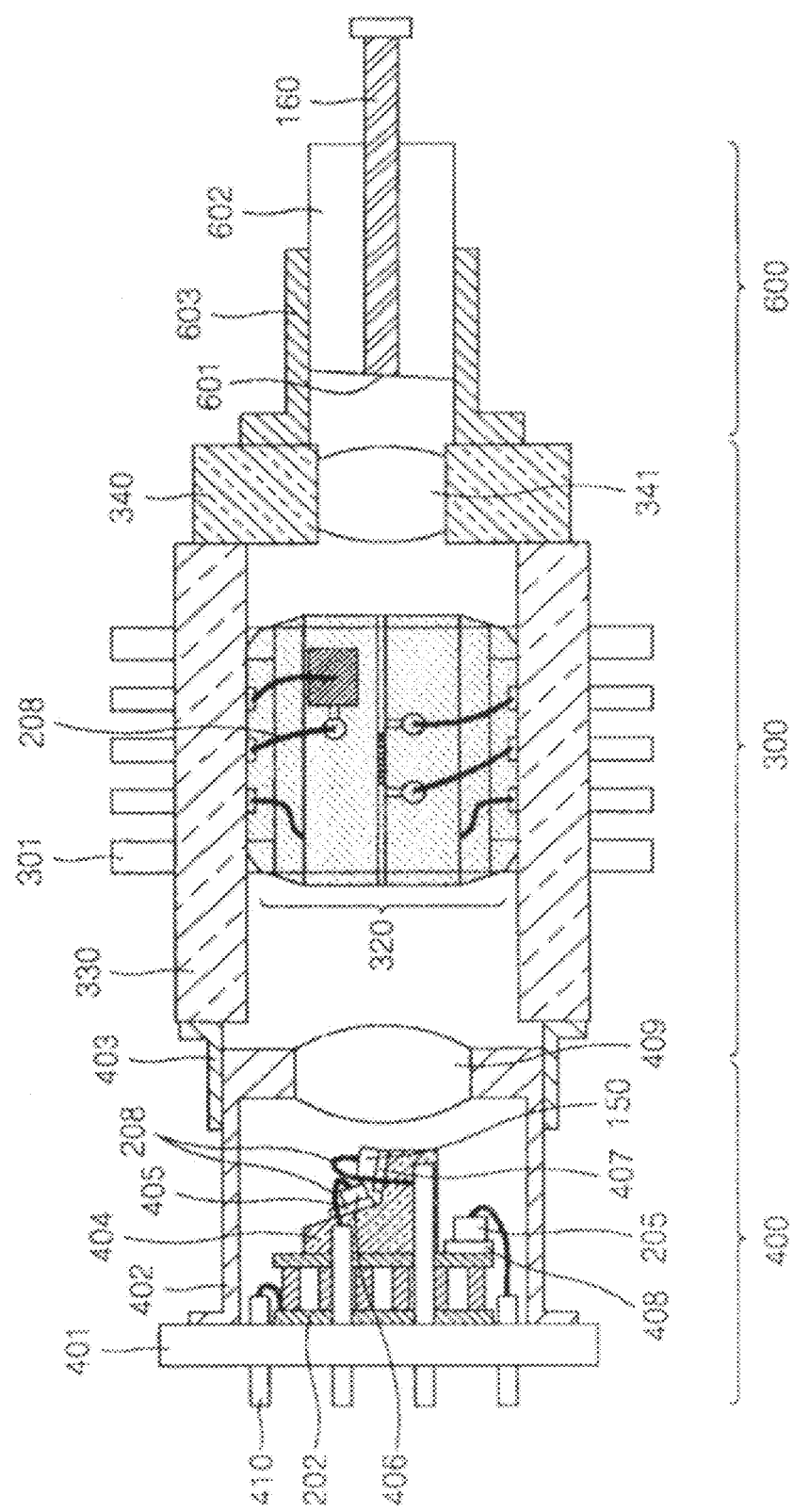
FIG. 10 illustrates a wavelength tunable light source according to another embodiment of the present invention.

FIG. 10 illustrates a wavelength tunable light source according to another embodiment of the present invention. In FIG. 10, the structure of a wavelength tunable light source using the optical axis alignment method suggested in FIG. 9 is shown. A PLC molding assembly 320 is shown by being rotated 90° with respect to the optical axis of FIG. 9 to help in understanding the drawing.

Referring to FIG. 10, the wavelength tunable light source of the present embodiment includes the RSOA portion 400, the PLC device portion 300, and the optical fiber portion 600. The respective parts of the wavelength tunable light source are individually packaged and mounted in each housing. As described in FIG. 9, each housing is coupled through the optical axis alignment. The RSOA portion 400 and the PLC device portion 300 are described in detail with reference to FIGS. 11A-11D.

Figure 11A:
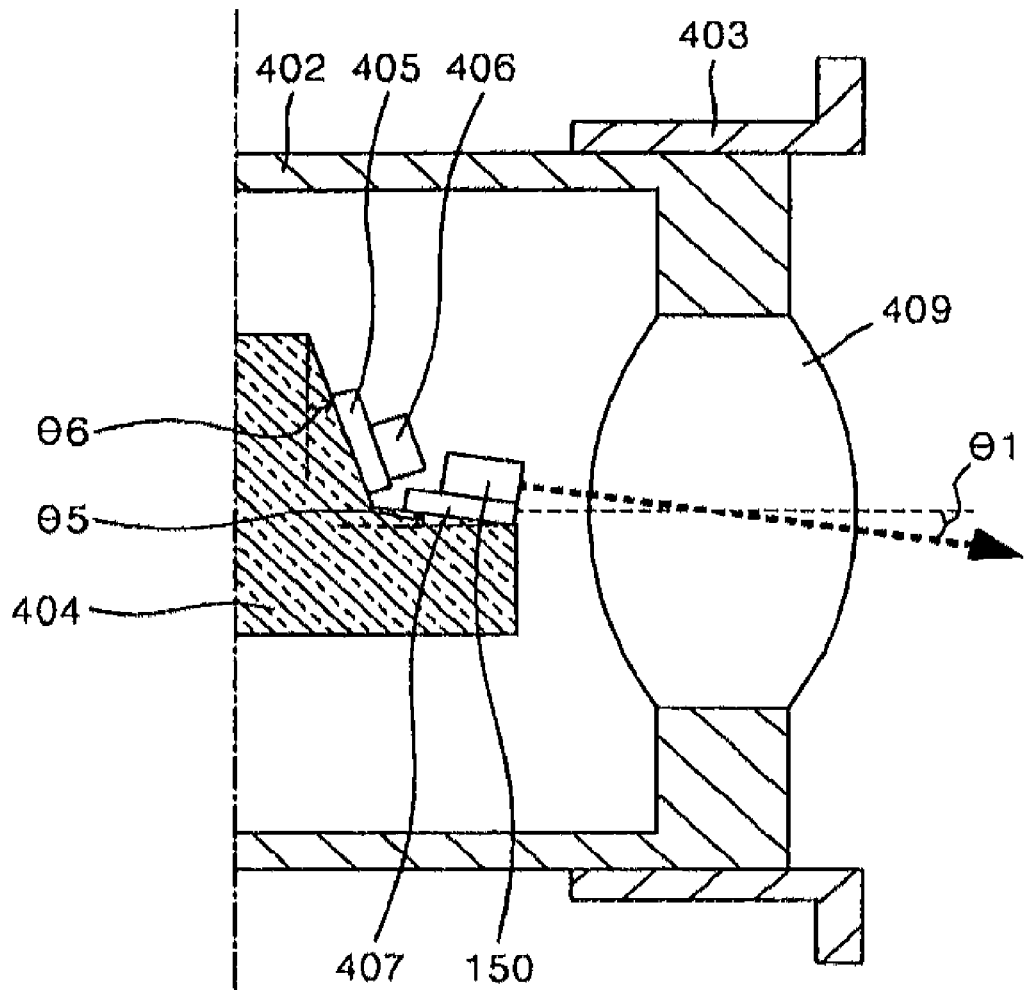
FIGS. 11A and 11B are a side view and a front view of a portion of the RSOA of the wavelength tunable light source of FIG. 10.
Figure 11B:
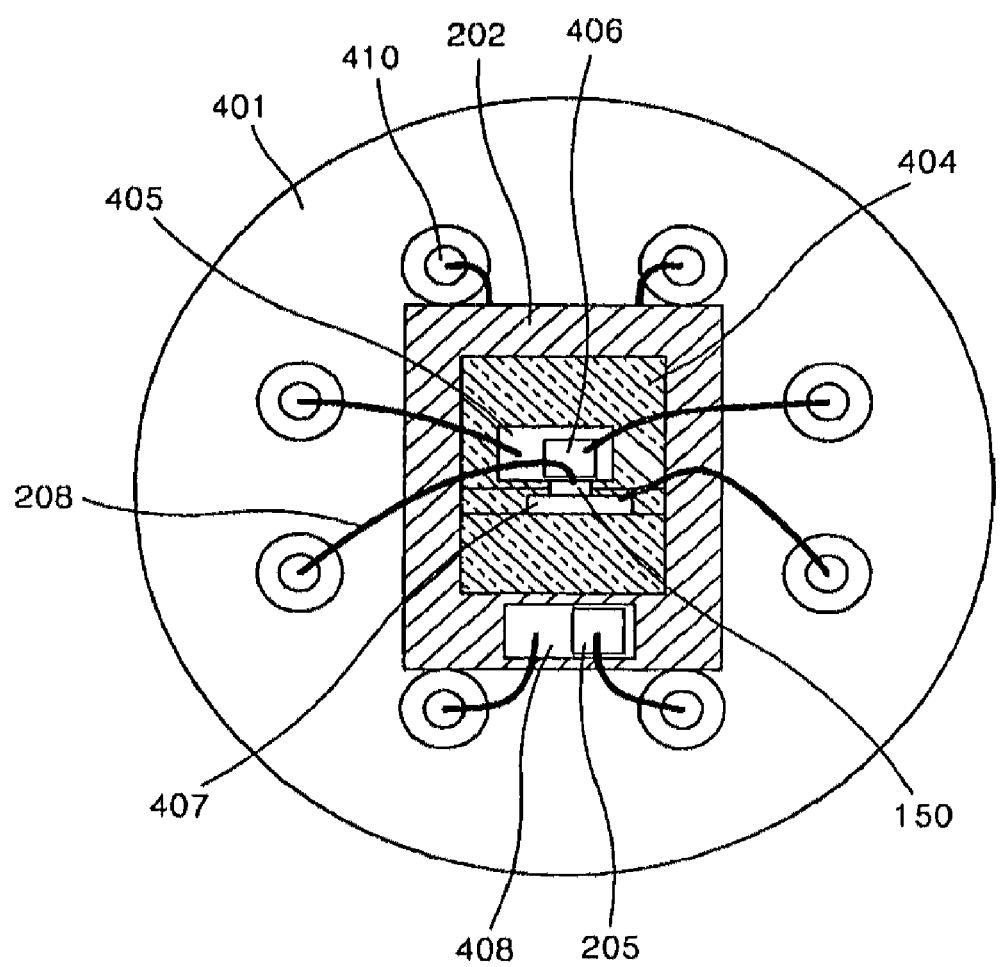

FIGS. 11A and 11B are a side view and a front view of a portion of the RSOA of the wavelength tunable light source of FIG. 10. For the convenience of explanation, FIG. 10 is also referred to in the following description. Referring to FIG. 11A, in the RSOA portion 400, the TEC 202 and the thermistor 205 are attached to a TO package 401. A pedestal 404 where the RSOA 150 and the monitoring photodetector 406 are attached is attached on an upper surface of the TEC 202. The pedestal 404 can be manufactured of a material having a superior thermal conductivity, such as ceramic or copper tungsten (CuW).

A TEC support (not shown) formed of a CuW material capable of buffering the difference in the thermal expansion coefficient between the TO package 401 and the TEC 202 can be inserted between the TO package 401 and the TEC 202. The angle $\theta 5$ of the pedestal 404 is the same as the angle $\theta 1$ of FIG. 9, preferably, between 2.5°-4.5°. The angle $\theta 6$ is preferably between 12°-15° to prevent reflection.

The RSOA 150 and the monitoring photodetector 406 are attached to the pedestal 404 by being attached to sub-mounts 405 and 407. A plurality of lead pins 410 are provided at the TO package 401 so that the RSOA 150, the thermistor 205, the TEC 202, and the monitoring photodetector 406 are connected to the lead pins 410 though a plurality of bonding wires 208. The TO package 401 is hermetically sealed by a cap 402 and the optical coupling lens 409.

The RSOA portion 400 is coupled to a super used stainless steel (SUS) housing 330 of the PLC device portion 300 using an SUS sleeve 403 for laser welding in a laser welding method. A ball lens or an aspherical lens can be used for the optical coupling lens 409.

The PLC device portion 300 is optically coupled to the RSOA portion 400 by the optical coupling lens 409 and to the attachment optical fiber 160 by the optical coupling lens 341. The PLC device portion 300 is coupled to the optical fiber portion 600 using a laser welding method through a lens holder 340 and an SUS sleeve 603. The attachment optical fiber 160 is mounted in a metal optical fiber ferrule 602 and fixed by thermal curing epoxy resin. The order of the optical alignment and coupling of the parts is firstly a coupling between the PLC SUS housing 330 and the lens holder 340 at the side of the attachment optical fiber 160, secondly a coupling between the optical fiber 160 and the lens holder 340 using the SUS sleeve 603, and thirdly a coupling between the cap 402 and the PLC SUS housing 330 using the SUS sleeve 403. Referring to FIG. 11B, the lead pins 410 of the TO package 401 are connected to the RSOA 150, the thermistor 205, the TEC 202, and the monitoring photodetector 406 through the bonding wire 208.

Figure 12A:
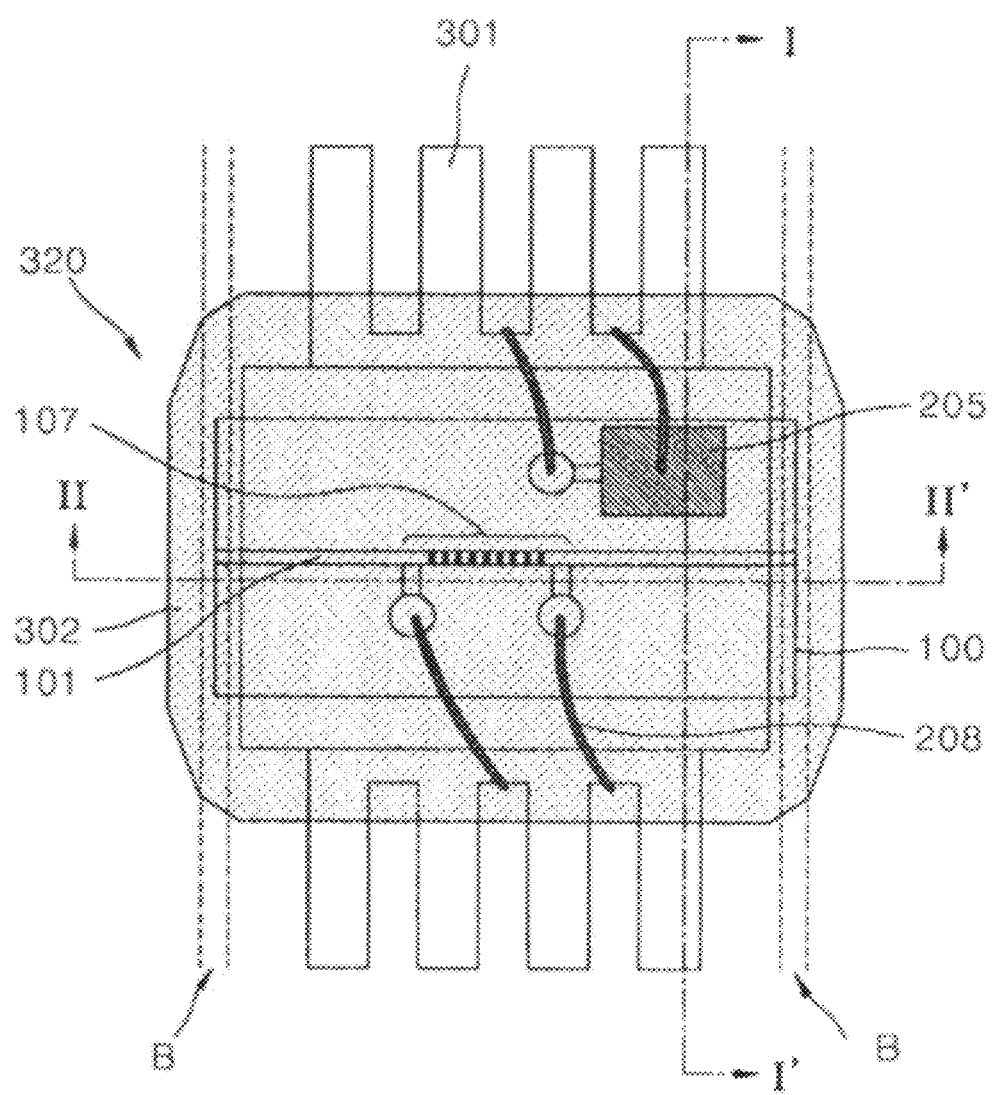
FIG. 12A is a plan view of a portion of a PLC device of the wavelength tunable light source of FIG. 10.
Figure 12B:
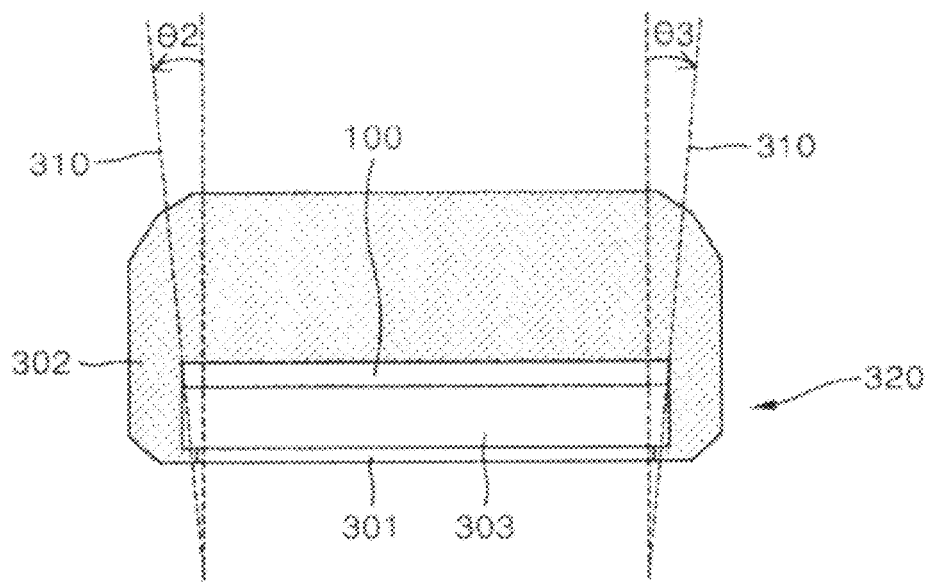
FIGS. 12B and 12C are cross-sectional views respectively taken along lines II-II' and I-I' of FIG. 12A.
Figure 12C:
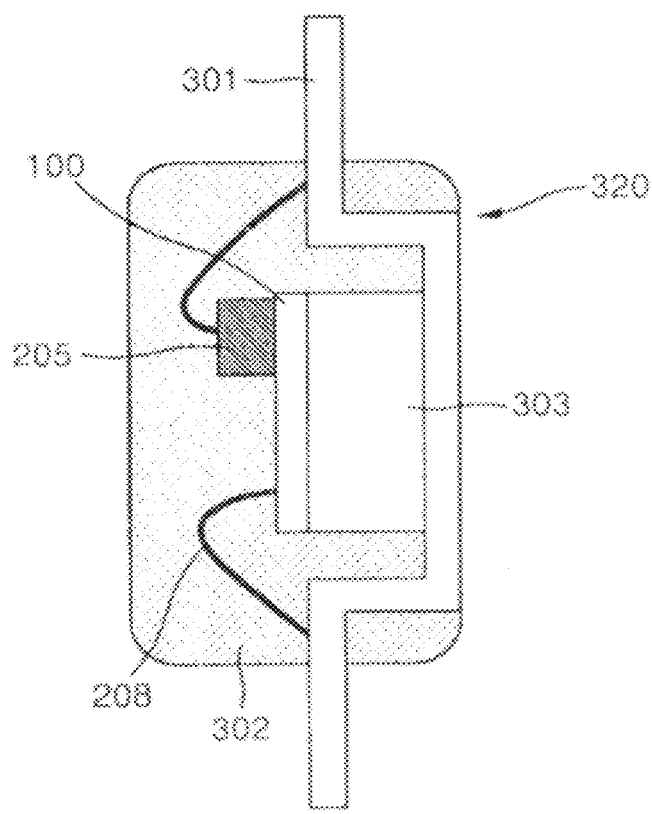

FIGS. 12A-12C are a plan view and cross-sectional views of a portion of a PLC device of the wavelength tunable light source of FIG. 10, showing a portion of the PLC molding assembly 320 in detail. FIGS. 12B and 12C are cross-sectional views respectively taken along lines II-II' and I-I' of FIG. 12A.

Referring to FIGS. 12A-12C, in the PLC molding assembly 320, the PLC device 100, including the optical waveguide core layer 101 where a wavelength tunable area, that is, the diffraction grating 102, is formed, and the thermistor 205, arranged on the surface of the PLC device 100, are assembled on a lead frame 301 with a height adjustment block 303 interposed therebetween. A pad of each part and the lead are connected through the bonding wire 208 and molded by the thermal curing resin or epoxy 302.

The molding type shown in the drawing is a mere example for the convenience of explanation and thus a variety of molding types are possible. The input and output surfaces 308 and 309 of FIG. 9 of the PLC molding assembly 320 of FIG. 12B are obtained by grinding the PLC molding assembly 320 along inclined grinding surfaces 310 having the angles of $\theta 2$ and $\theta 3$ until the optical wavelength core layer 101 is exposed. The grinding angles $\theta 2$ and $\theta 3$ are preferably a value in a range between 5°-10°. Dotted lines B of FIG. 12A show a difference in the horizontal interval in the upper and lower portions of the grinding surfaces 310. After the molding and grinding are complete, a final PLC molding assembly 320 is complete by cutting and removing a metal connection portion at both ends of the lead frame 301.

Figure 13:
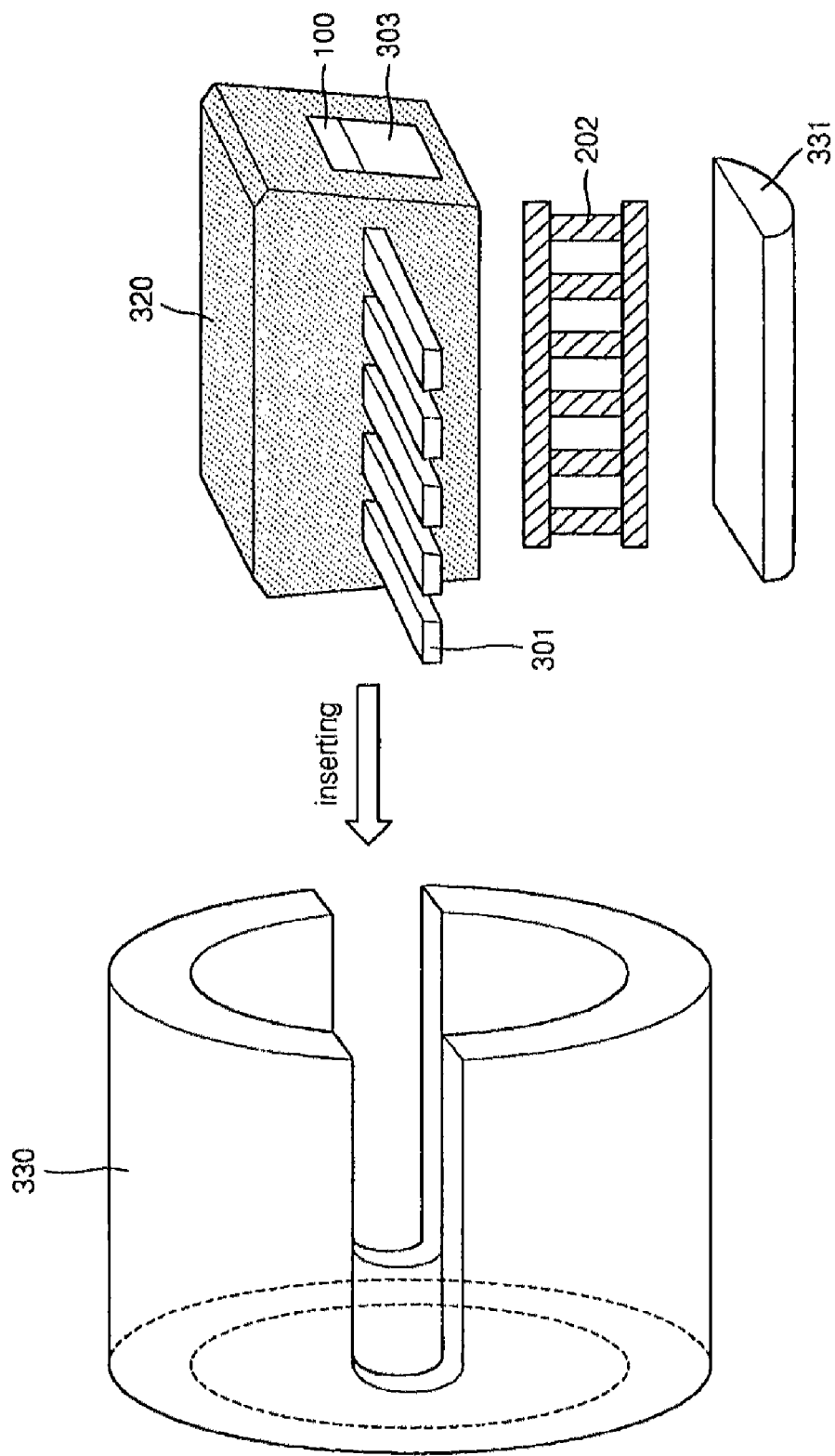
FIG. 13 is a perspective view illustrating the PLC molding assembly of FIG. 12A is installed in SUS housing.

FIG. 13 is a perspective view illustrating the PLC molding assembly 320 of FIG. 12A is installed in the SUS housing 330. Referring to FIG. 13, in the PLC device portion 300, the PLC molding assembly 320 is inserted in the SUS housing 330 with the TEC 202 and the heat sink 331. The heat sink 331 can be manufacture of Cu or CuW and has a semicircular cross-section. The heat sink 331 has a function to transfer heat generated from the TEC 202 to the SUS housing 330. The PLC molding assembly 320, the TEC 202, and the heat sink 331 are assembled using solder or thermal conductive epoxy. The lead of the TEC 202 is connected to an unused lead of the lead frame 301.

Figure 14A:
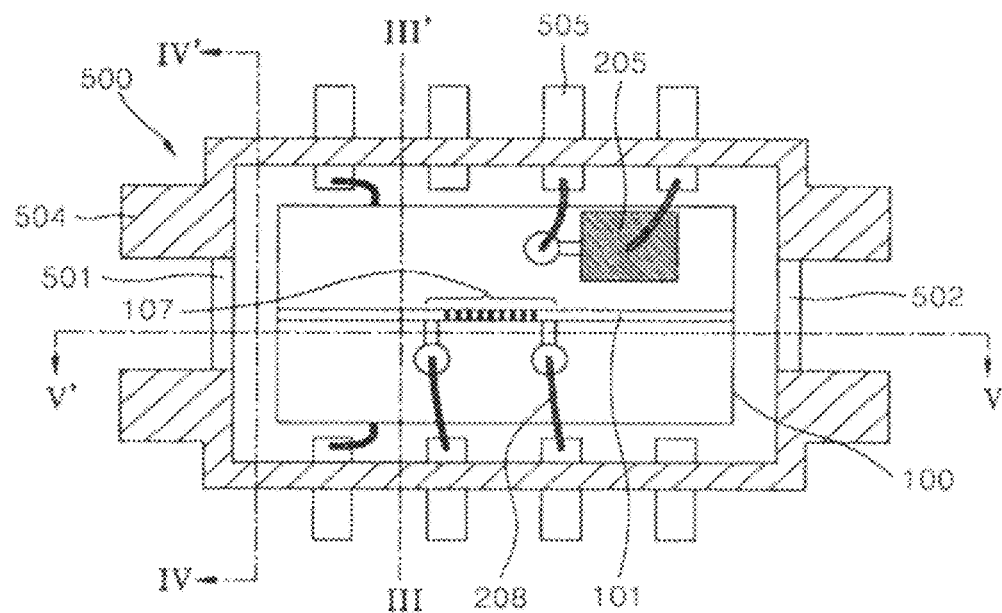
FIG. 14A is a plan view of another PLC device according to another embodiment of the present invention which can be applied to the wavelength tunable light source of FIG. 10.
Figure 14B:
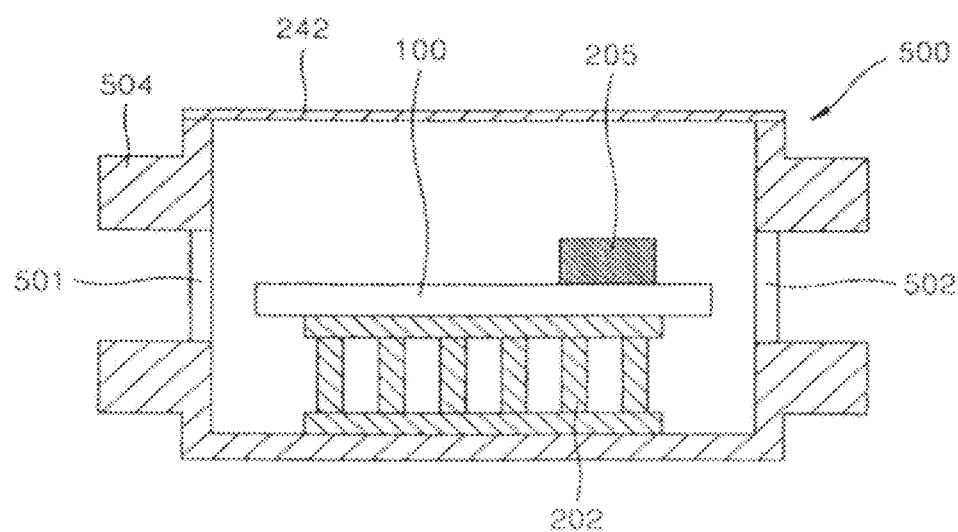
FIGS. 14B-14D are cross-sectional views respectively taken along lines V-V', III-III', and IV-IV' of the PLC device of FIG. 14A.
Figure 14C:
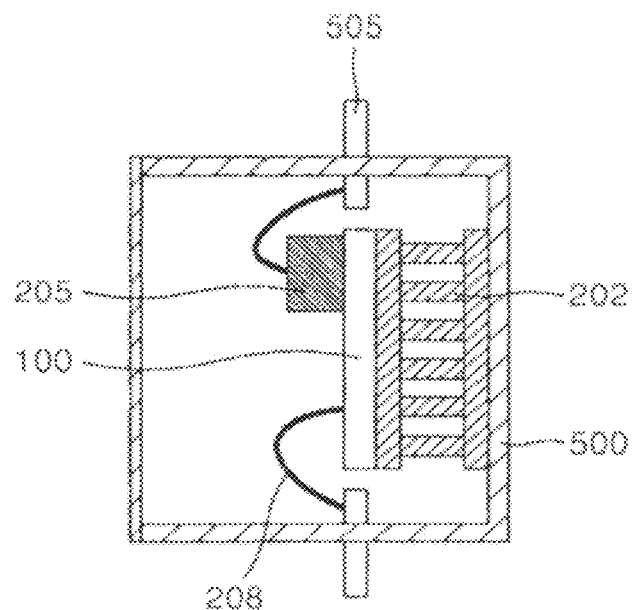
Figure 14D:
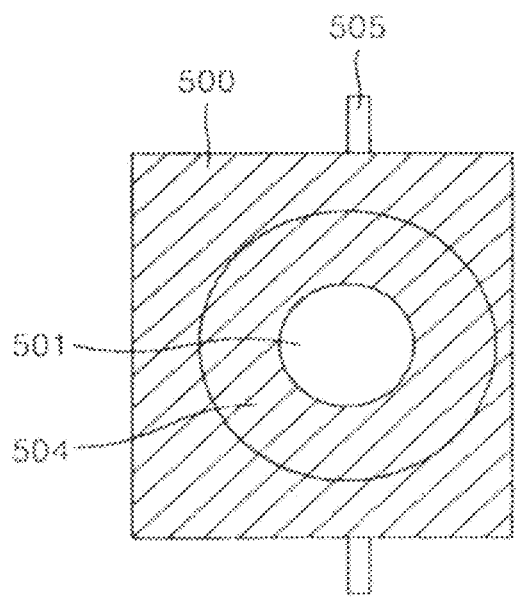

FIGS. 14A-14D are a plan view and cross-sectional views of another PLC device according to another embodiment of the present invention which can be applied to the wavelength tunable light source of FIG. 10. FIGS. 14B-14D are cross-sectional views respectively taken along lines V-V', and IV-IV' of the PLC device of FIG. 14A.

Referring to FIG. 14A, unlike the molding structure of the PLC device 100 of FIGS. 12 and 13 using the thermal curing resin, in the PLC device according to the present embodiment, the PLC device 100 is included in a mini-DIL (dual-in-line) or butterfly type completely sealed mini butterfly package 500 with the TEC 202 and the thermistor 205 by being bonded to a lead 505 through the bonding wires 208. Transparent windows 501 and 502 for the optical coupling with the RSOA 150 and the attachment optical fiber 160 are attached to the mini butterfly package 500. The transparent windows 501 and 502 can be AR coated to reduce reflection. A cylindrical flange 504 is provided at both ends of the mini butterfly package 500 where the transparent windows 501 and 502 exist for the assembly between the RSOA 150 and the optical fiber 160 in a laser welding method. The flange 504 can be manufactured of kovar or SUS.

The WDM-PON system with a wavelength tunable optical transmitter that is automatically tuned to an external input optical wavelength and mounted on an ONU according to the present invention, the structure of the wavelength tunable optical transmitter, and the processes of the initialization and stabilization according to the input wavelength in the wavelength tunable optical transmitter are described below.

Figure 15:
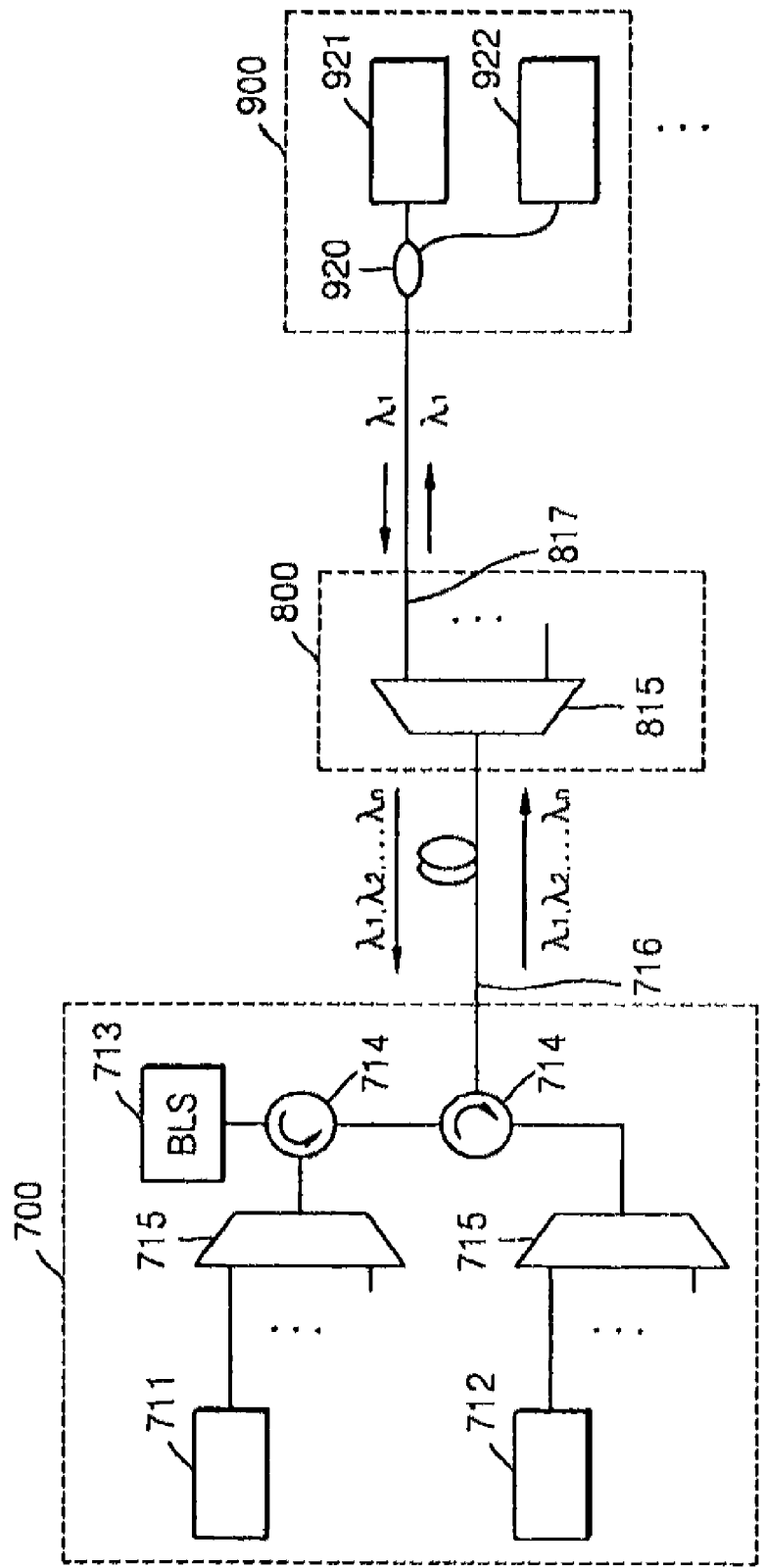
FIG. 15 illustrates the structure of an upstream/downstream identical wavelength transmitting WDM-PON having a wavelength tunable optical transmitter mounted on an ONU according to another embodiment of the present invention.

FIG. 15 illustrates the structure of an upstream/downstream identical wavelength transmitting WDM-PON having a wavelength tunable optical transmitter mounted on an ONU according to another embodiment of the present invention. Referring to FIG. 15, a WDM-PON link structure includes an optical line terminal (OLT) 700 located at a central office, an optical network unit or terminal (ONU/ONT) 900 and a remote node (RN) 800. The OLT 700 and the RN 800 are connected by a single core feeder optical fiber 716. The RN 800 and the ONU/ONT 900 are connected by a distribution optical fiber 817.

A downstream optical signal is transferred from a reference optical wavelength light source in the OLT 700, that is, a broadband source (BLS) 713 sequentially to an optical circulator 714, an arrayed-waveguide grating (AWG) 715 having a WDM multi/demultiplexing function, an optical transmitter 711 for the OLT 700, an AWG 715, an optical circulator 714, the feeder optical fiber 716, and an AWG 815 of the RN 800. Then, the downstream optical signal is transferred, via the distribution optical fiber 817 and a 1×2 optical coupler 920 in the ONU/ONT 900, finally to an optical transmitter 921 and an optical receiver for the ONU.

The down and upstream optical signals are briefly described based on the concept of the operation wavelength. When the optical transmitter 711 for the OLT 700 transmits a downstream signal with the operation wavelength that is automatically tuned to the wavelength of the WDM demultiplexed BLS 713, the optical receiver 922 for the ONU 900 receives the downstream optical signal and simultaneously a part of the downstream optical signal automatically tunes the operation wavelength of the optical transmitter 921 for the ONU 900. Accordingly, the optical transmitter 921 for the ONU 900 transmits the upstream optical signal with the operation wavelength that is automatically tuned to the downstream optical signal.

The upstream optical signal is transferred in the opposite direction to that of the downstream optical signal. That is, the upstream optical signal having an operation wavelength that is automatically tuned to the wavelength of the downstream optical signal of the optical transmitter 711 for the OLT 700 is transferred from the optical transmitter 921 for the ONU 900 to the optical receiver 712 for the OLT 700 via the 1×2 optical coupler 920, the distribution optical fiber 817, the AWG 815 of the RN 800, the feeder optical fiber 716, the optical circulator 714 and the AWG 715.

Thus, since the wavelength tunable optical transmitter automatically tuned to an external input optical wavelength is applied to the optical transmitter 921 of the ONU 900, the WDM-PON link structure according to the present embodiment can embody the upstream/downstream identical wavelength transmitting WDM-PON. Accordingly, the inventory management for a complicated WDM wavelength management mechanism or an expensive single wavelength light source is not needed so that a simple and economic FTTH can be realized.

The BLS 713 of the OLT 700 is a light source to emit a broad-band light including a communication wavelength range. A luminescent diode (LED), an amplified spontaneous emission (ASE) source, and a high brightness light emitting LED are mainly used as the BLS 713 for the OLT 700. Also, a light source in which a plurality of single wavelengths are integrated, such as a distributed feedback-laser diode (DFB-LD) array or a fiber ring laser, can be used as the BLS 713 for the OLT 700.

The RN 800 further includes an optical power splitter so that each optical wavelength is shared with a plurality of the ONU/ONT 900 in a time division multiplexing (TDM) method. That is, since the optical signal is processed in the TDM method and distributed to the ONU/ONT 900, each optical signal can be distributed to a plurality of low speed data subscribers.

Figure 16:
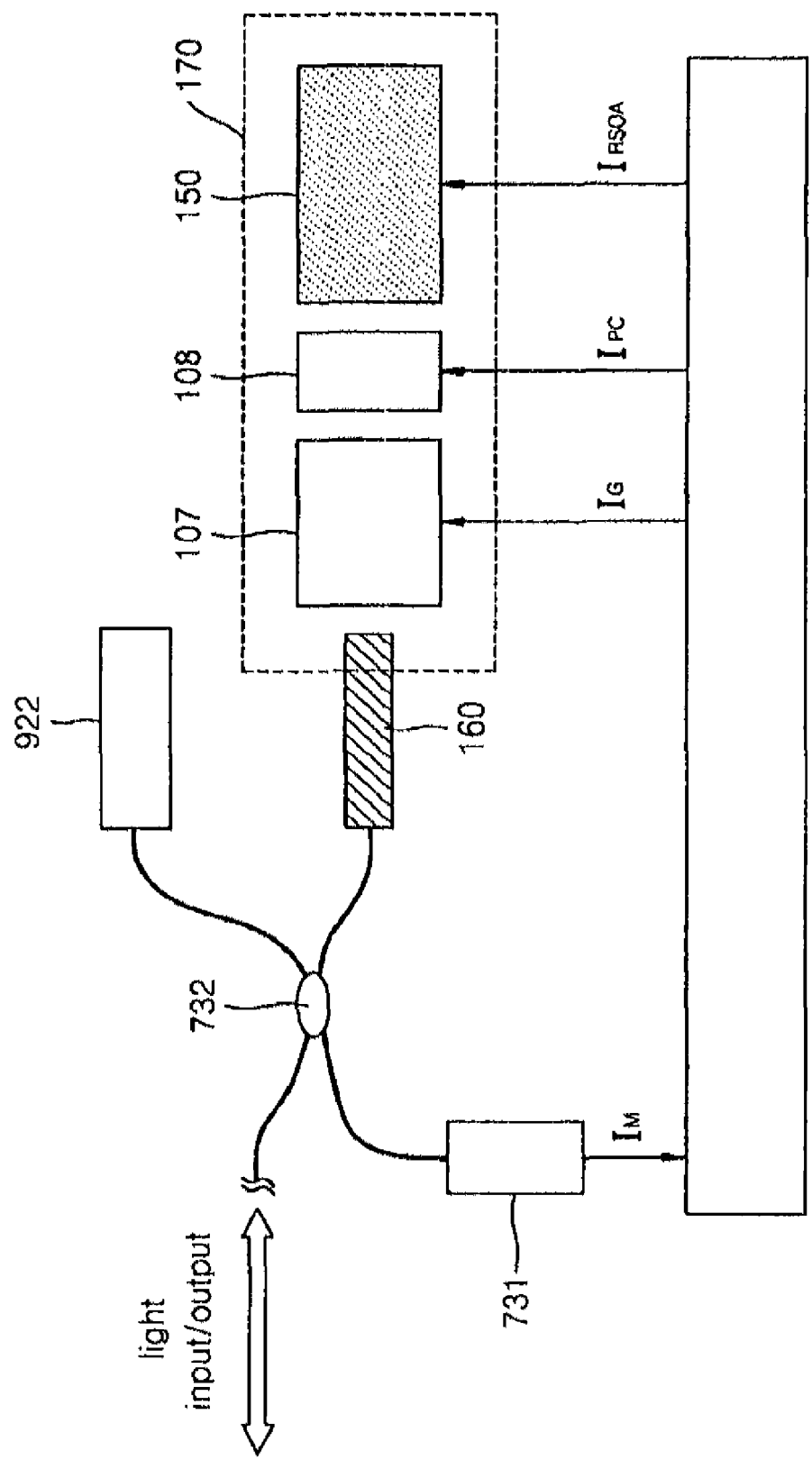
FIG. 16 illustrates the structure of a wavelength tunable optical transmitter according to another embodiment of the present invention which has an oscillation wavelength that is automatically tuned to an external input optical wavelength.

FIG. 16 illustrates the structure of a wavelength tunable optical transmitter according to another embodiment of the present invention which has an oscillation wavelength that is automatically tuned to an external input optical wavelength and is mounted in the WDM-PON of FIG. 15. Referring to FIG. 16, the wavelength tunable optical transmitter according to the present embodiment includes the wavelength tunable light source (PLC-ECL) 170 described with reference to FIG. 10, a 2×2 optical coupler 732, an optical power monitor 731, and a wavelength tuning control unit 740. The optical power monitor 731 detects the output optical power of the upstream/downstream optical signal. The wavelength tuning control unit 740 receives a signal of the optical power monitor 731 and controls current supplied to each functional area.

When the wavelength tunable optical transmitter is used for the WDM-PON, in the structure of the ONU/ONT 900 of FIG. 15, the 1×2 optical coupler 920 is replaced by the 2×2 optical coupler 732, the optical power monitor 731 is added to an additional port at the upstream side of the 2×2 optical coupler 732, and the optical receiver 922 is connected to an extra port at the downstream side. Accordingly, the overall structure of the wavelength tunable optical transmitter of FIG. 16 functions as the optical transmitter/receiver of the ONU/ONT 900.

The wavelength tunable optical transmitter can be used not only for the ONU/ONT 900, but also for the optical transmitter of the OLT 700. However, since the transmitted optical wavelength of the wavelength tunable optical transmitter needs to be tuned to the optical wavelength of the BLS 713, an appropriate optical coupler is needed.

As described above, the operation principle of the PLC-ECL 170 is as follows. A reflection wavelength range is adjusted using the Bragg grating 102 of the PLC device 100 and only a wavelength matched to the reflection wavelength range of the Bragg grating 102 of the ECL modes is oscillated. Since the period of the Bragg grating 102 selecting an oscillation wavelength can be controlled using the change in the refractivity (thermo-optic effect) of an optical waveguide material with respect to the temperature, an optical transmitter having a varying oscillation wavelength can be embodied by controlling the temperature through a grating control current $I_G$. The external oscillation modes can be finely adjusted by controlling the temperature through a phase control current $I_{PC}$ applied to the phase control area 108. Accordingly, the side-mode suppression ratio (SMSR) and output power of the oscillation spectrum can be adjusted. That is, the wavelength tunable optical transmitter automatically tuned to an external input optical wavelength can be embodied considering the fact that the reflection wavelength control function and the wavelength reflection characteristic of the Bragg grating 102 through the $I_G$ is symmetrically represented at both ends of the optical waveguide core layer 101 of the PLC 100.

An optical signal input from the outside is input to the wavelength tunable area 107 through the 2×2 optical coupler 732. The Bragg grating 102 selectively reflects the input optical signal according to the value $I_G$. When the reflection wavelength range of the Bragg grating 102 matches the input optical wavelength, most of the input optical signal is reflected and a part of the reflected signal is input to the optical power monitor 731 via the 2×2 optical coupler 732. The optical power monitor 731 transfers an optical power monitoring current $I_M$ corresponding to the amplitude of the input optical signal to the wavelength tuning control unit 740.

In the oscillation wavelength initialization process, the wavelength tuning control unit 740 varies the reflection wavelength range of the Bragg grating 102 so that the value $I_G$ at which $I_M$ has the maximum value can be determined. Since the oscillation wavelength of the PLC-ECL 170 is determined by the reflection wavelength range of the Bragg grating 102 according to the determined value $I_G$, the output optical wavelength of the PLC-ECL 170 automatically matches the input optical wavelength. Also, the optical output of the PLC-ECL 170 determined by the value $I_G$ that is automatically tuned and thus fixed is partially input to the optical power monitor 731 by the 2×2 optical coupler 732 so that $I_M$ is input to the wavelength tuning control unit 740. The wavelength tuning control unit 740 continuously monitors $I_M$ and controls $I_{PC}$ so that the optical output of the PLC-ECL 170 is maximum, that is, so that $I_M$ is maximum. Thus, the oscillating optical wavelength can be stably maintained.

Figure 17:
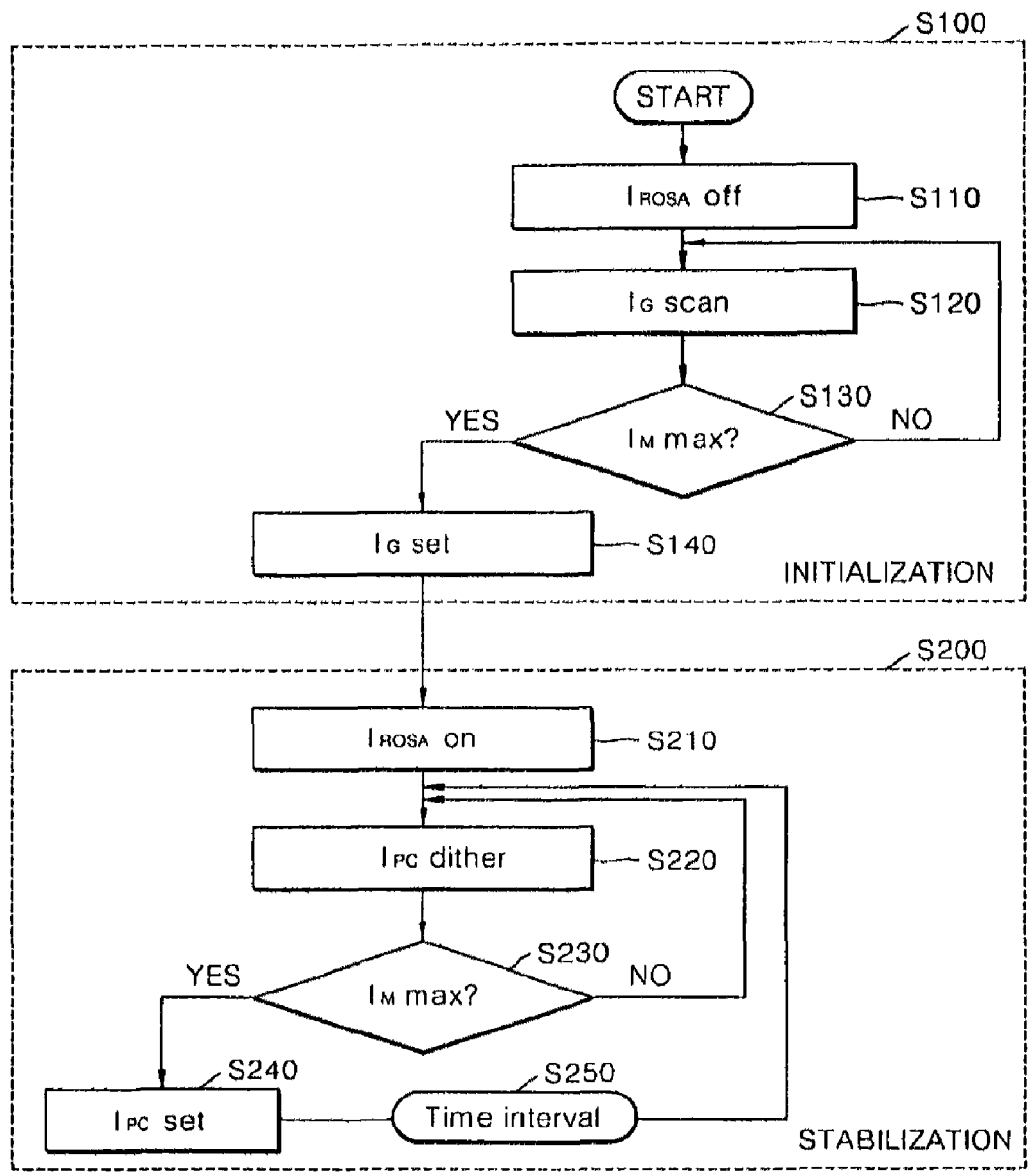
FIG. 17 is a flowchart showing the process of tuning the oscillation wavelength to the external input wavelength in the wavelength tunable optical transmitter of FIG. 16.

FIG. 17 is a flowchart showing the process of tuning the oscillation wavelength to the external input wavelength in the wavelength tunable optical transmitter of FIG. 16. The operation of the wavelength initialization and stabilization through the wavelength tuning control portion 740 is described with reference to FIG. 16.

Referring to FIG. 17, the wavelength tuning control unit 740 cuts off an RSOA control current $I_{RSOA}$ to determine the value $I_G$ matching the input optical wavelength (S110). $I_G$ is scanned in a state in which the power is cut off (S120). It is determined whether $I_M$ is maximum (S130). The value $I_G$ when the $I_M$ is maximum is fixed (S140). The initialization adjusting the reflection wavelength of the Bragg grating 102 with respect to the input optical wavelength is complete (S100).

When the wavelength initialization step (S100) is complete, a wavelength stabilization step (S200) is performed. In the wavelength stabilization step (S200), $I_{RSOA}$ is input, that is, $I_{RSOA}$ is turned on, to operate the PLC-ECL 170 (S210). $I_{PC}$ is controlled with the value at which $I_M$ is maximum (S220). The control of $I_{PC}$ is performed in a dithering method and whether $I_M$ is maximum is determined through $I_{PC}$ control (S230). Then, the value $I_{PC}$ when $I_M$ is maximum is fixed (S240) so that the wavelength stabilization is achieved. Even when the value $I_{PC}$ is set for the wavelength stabilization, the wavelength stabilization step is continuously performed by restarting a wavelength stabilization control loop after a predetermined time. Thus, an optical signal having high quality output and wavelength is maintained so that the reliability of the optical signal transmission is obtained.

While this invention has been particularly shown and described with reference to preferred embodiments thereof, it will be understood by those skilled in the art that various changes in form and details may be made therein without departing from the spirit and scope of the invention as defined by the appended claims.

INDUSTRIAL APPLICABILITY

As described above, in the manufacture and application of a PLC-ECL type wavelength tunable light source, the present invention provides a wavelength tunable mechanism with improved performance and stability, a light source with improved packaging and mass productivity prospects, and a light source applied to a WDM-PON with initialization and stabilization functions.

The invention claimed is:

1. A wavelength tunable light source having a PLC-ECL (external cavity laser) structure, the wavelength tunable light source comprising:
   a first housing in which a semiconductor optical gain medium is mounted;
   a second housing in which a PLC device is mounted; and
   a third housing in which an optical fiber is mounted,
   wherein the first, second, and third housings make an optical axis alignment through an optical coupling lens and are combined in a laser welding method.

2. The wavelength tunable light source of claim 1, wherein the semiconductor optical gain medium is either a reflective semiconductor optical amplifier (RSOA) or a reflective laser diode (R-LD) which has the reflectivity of a front exit surface is not more than 0.1% and the reflectivity of a rear exit surface is not less than 30%.

3. The wavelength tunable light source of claim 1, wherein the semiconductor optical gain medium is attached to a pedestal having an inclined surface between 2.5°-4.5° such that the optical axis of the semiconductor optical gain medium and the optical axis of the optical coupling lens form an angle between 2.5°-4.5°, and the pedestal is formed of ceramic or copper tungsten (CuW).

4. The wavelength tunable light source of claim 1, wherein the first housing includes a thermo-electric cooler (TEC) and a thermistor, the semiconductor optical gain medium has a TO package structure, and a cuboidal TEC support formed of copper tungsten (CuW) having a coefficient of thermal expansion (CTE) different from the CTE of the TEC, the difference being within 10%, is inserted between the TEC and the TO package.

5. The wavelength tunable light source of claim 1, wherein the PLC device comprises a silicon substrate, a heat blocking layer formed on the silicon substrate, a thin film metal heater formed on the heat blocking layer, and an optical waveguide having clad layers and a core layer formed of polymer on the thin film metal heater, a coefficient of thermal expansion (CTE) or a thermo-optic coefficient of the polymer of the core layer is $(-0.7 \sim -3.4) \times 10^{-4}/K$, a Bragg grating is formed in the core layer located above a portion where the thin film metal heater is formed, and the reflection wavelength of the Bragg grating is adjustable by driving the thin film metal heater to use a thermo-optic effect.

6. The wavelength tunable light source of claim 1, wherein the PLC device is mounted on a lead frame with a thermistor and molded with thermal curing resin or epoxy resin, and cross-sectional surfaces at both ends of the PLC device are grinded at an angle between 5°-10° so that input and output surfaces of the optical waveguide are exposed.

7. The wavelength tunable light source of claim 1, wherein the second housing has a completely sealed housing structure of a mini butterfly package, the PLC device is mounted in the second housing with the TEC and thermistor, and a transparent window and a SUS flange for laser welding assembly are attached at each of both ends of the second housing so that the PLC device is optically coupled to the semiconductor optical gain medium and the optical fiber.

8. A wavelength tunable optical transmitter comprising:
the wavelength tunable light source of claim 1;
a 2×2 optical coupler;
an optical power monitor monitoring an optical output; and
a wavelength tuning control unit controlling an output optical signal wavelength of the wavelength tunable light source,
wherein the wavelength tunable optical transmitter outputs an optical signal wavelength by being automatically tuned to an optical signal wavelength that is externally input.

9. The wavelength tunable optical transmitter of claim 8, wherein the wavelength tunable light source comprises a semiconductor optical gain medium, a Bragg grating area, and a phase control area, and the wavelength tuning control portion receives a current signal from the optical power monitor and controlling current injections into the semiconductor optical gain medium, the Bragg grating area, and the phase control area of the wavelength tunable light source.

10. The wavelength tunable optical transmitter of claim 8, wherein the wavelength tunable optical transmitter has an optical receiver attached at one of output ports of the optical coupler and is used for a wavelength division multiplexing (WDM)-passive optical network (PON).

11. A wavelength division multiplexing (WDM)-passive optical network (PON) comprising:
an optical line terminal (OLT) having a reference optical wavelength light source (a seed light source), an optical circulator, a wavelength multi/demultiplexer, and an optical transmitter and an optical receiver;
a remote node (RN) having a wavelength multi/demultiplexer; and
an optical network unit or terminal (ONU/ONT) having an optical coupler, and an optical transmitter and an optical receiver,
wherein the wavelength tunable optical transmitter of claim 8 that is automatically tuned to an externally input optical signal wavelength and outputs an optical signal wavelength by varying the optical signal wavelength is used in the optical transmitter of the OLT and the optical transmitter of the ONU/ONT to transmit an upstream/downstream optical signal wavelength.

12. The WDM-PON of claim 11, wherein the reference optical wavelength light source is any one of a luminescent diode (LED) or an amplified spontaneous emission (ASE) source emitting a broad-band light including a WDM wavelength range, and a distributed feedback-laser diode (DFB-LD) module array or a fiber ring laser in which a plurality of single wavelength light sources corresponding to the WDM wavelengths are integrated.

13. The WDM-PON of claim 11, wherein the RN further comprises an optical power splitter and each of optical wavelengths is shared with a plurality of the ONUs/ONTs in a time division multiplexing (TDM) method.

* * * * *